United States Patent [19]

Kawamura et al.

[11] Patent Number: 5,581,107
[45] Date of Patent: Dec. 3, 1996

[54] NONVOLATILE SEMICONDUCTOR MEMORY THAT EASES THE DIELECTRIC STRENGTH REQUIREMENTS

[75] Inventors: Shouichi Kawamura; Nobuaki Takashina; Yasushi Kasa; Kiyoshi Itano, all of Kawasaki, Japan

[73] Assignee: Fujitsu Limited, Kawasaki, Japan

[21] Appl. No.: 358,604

[22] Filed: Dec. 14, 1994

Related U.S. Application Data

[62] Division of Ser. No. 186,118, Jan. 25, 1994, Pat. No. 5,406,524.

[30] Foreign Application Priority Data

Mar. 17, 1993 [JP] Japan ................... 5-057380

[51] Int. Cl.⁶ ............... H01L 29/80; H01L 27/02; H01L 29/78
[52] U.S. Cl. .................. 257/392; 257/322; 257/348; 257/371; 257/402
[58] Field of Search ................. 257/316, 315, 257/368, 322, 343, 348, 321, 390, 393, 401, 402

[56] References Cited

U.S. PATENT DOCUMENTS

| | | |
|---|---|---|
| 3,660,819 | 5/1972 | Frohman-Bentchkowsky ........ 365/185 |
| 4,072,868 | 2/1978 | De LaMoneda et al. ............. 257/392 |
| 4,559,694 | 12/1985 | Yoh et al. .............................. 257/412 |
| 4,580,247 | 4/1986 | Adam .................................... 257/316 |
| 4,937,700 | 6/1990 | Iwahashi ............................... 257/368 |
| 4,951,114 | 8/1990 | Lewis et al. .......................... 257/476 |

FOREIGN PATENT DOCUMENTS 0007557  1/1989  Japan .................................... 257/391

*Primary Examiner*—Robert P. Limanek
*Assistant Examiner*—Alexander Oscar Williams
*Attorney, Agent, or Firm*—Nikaido, Marmelstein, Murray & Oram LLP

[57] ABSTRACT

An object of the present invention is to ease the dielectric strength requirements for transistors forming power supply circuits or the like. A nonvolatile semiconductor memory of the present invention includes a plurality of memory cells, each of which is composed of a floating gate, a control gate, a drain, and a source, and a negative voltage generating means whose generated negative voltage is applied to the control gate for drawing a charge stored in the floating gate into a channel or the source when stored data is erased electrically. The nonvolatile memory of the present invention further includes positive erasure voltage generating means, and a positive voltage higher than a conventional supply voltage generated by the positive erasure voltage generating means is applied to the channel or the source.

12 Claims, 31 Drawing Sheets

WRITE

READ

---- : ENHANCEMENT TYPE

——— : DEPLETION TYPE

---- : ENHANCEMENT TYPE

——— : DEPLETION TYPE

Fig.34A
TOP PLAN
Fig.34B
YY' CROSS SECTION
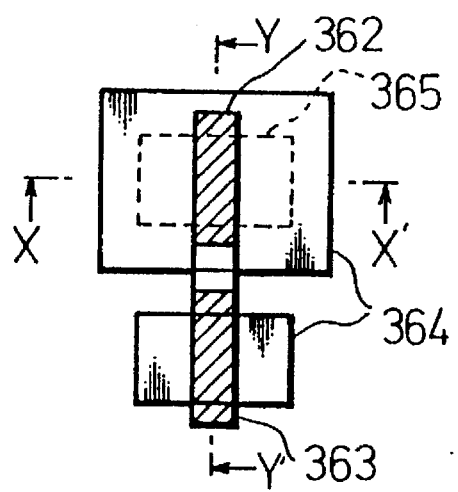
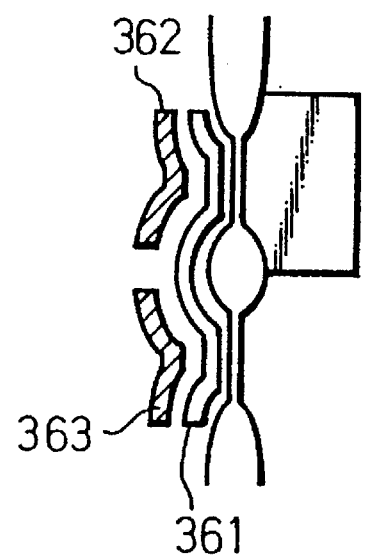
Fig.34C
XX' CROSS SECTION
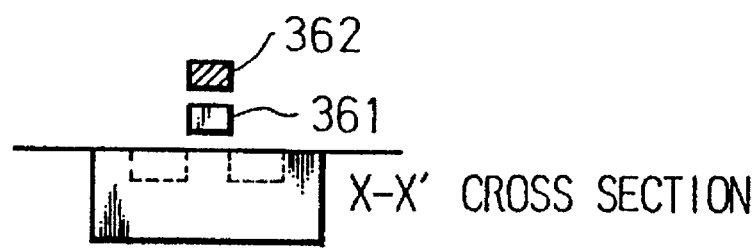

Fig.35A
TOP PLAN
Fig.35B
YY' CROSS SECTION
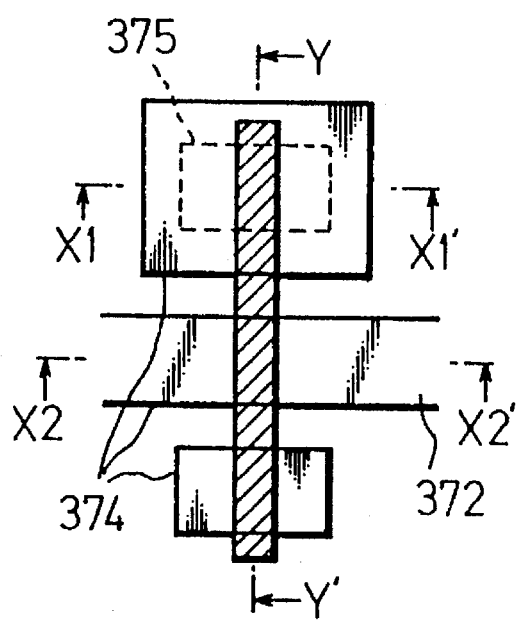
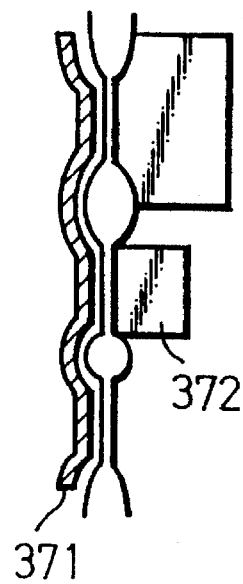
Fig.35C
X1X1' CROSS SECTION
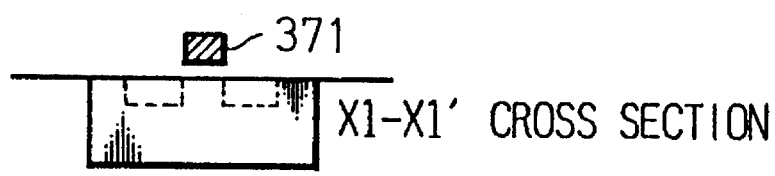
X1-X1' CROSS SECTION
Fig.35D
X2X2' CROSS SECTION

NONVOLATILE SEMICONDUCTOR MEMORY THAT EASES THE DIELECTRIC STRENGTH REQUIREMENTS

This is a division of application Ser. No. 08/186,118 filed Jan. 25, 1994, now U.S. Pat. No. 5,406,524.

BACKGROUND OF THE INVENTION (1) Field of the Invention

The present invention relates generally to electrically erasable nonvolatile semiconductor memories and semiconductor devices having structures useful for the fabrication of circuits used for the same, and more particularly to a nonvolatile semiconductor memory of the configuration that eases the dielectric strength requirements, and a semiconductor device having such a circuit configuration, and further, to a semiconductor device that serves to simplify the fabrication process.

(2) Description of the Related Art

Electrically rewritable nonvolatile memories include, for example, $E^2PROM$; and among others, flash memory having total or selective total erasure capabilities has been attracting attention in recent years because of its high bit-density capabilities.

The memory cell of the flash memory has a two-layered gate structure consisting of a control gate and a floating gate, in which information storage is accomplished by utilizing the property that when prescribed voltages are applied to the control gate, drain, and source, the current flowing between the drain and the source varies depending on whether or not a charge is stored on the floating gate. Generally, in flash memories, injecting a charge into the floating gate is called writing.

For writing, a high voltage VPP (about 12 V) is applied to the control gate, about 6 V is applied to the drain, and 0 V is applied to the source. Under these conditions, electrons flowing through the memory cell encounter a high electric field near the drain, and part of the electrons, accelerated by this field, gain enough energy to overcome the energy barrier of the gate insulating film and are injected into the floating gate. Since the floating gate is electrically isolated from other circuit regions, the injected charge can be stored thereon semipermanently.

For reading, a supply voltage VCC (about 5 V) is applied to the control gate, about 1 V is applied to the drain, and 0 V is applied to the source. The threshold voltage of the cell transistor varies depending on the presence or absence of a charge on the floating gate, so that the current flowing through the selected memory cell varies accordingly. By sensing and amplifying this current, the information is read out.

There are two main methods of erasure: one is the channel erasure method in which the charge stored on the floating gate is drawn into the channel, i.e., into the substrate or a well, and the other is the source erasure method in which the charge is drawn into the source.

In channel erasure, 0 V is applied to the control gate, the drain and source S are left open, and a high voltage VPP (about 12 V) is applied to the channel (p-well). This causes the charge stored on the floating gate to be drawn into the channel. In source erasure, the high voltage VPP is applied to the source, and the channel is left opened or connected to ground.

The recent trend for semiconductor devices has been toward lower supply voltages, and the reduction of supply voltages has also been pushed forward for flash memories. The lower voltage design also requires the reduction of the high voltage applied to the channel or source for erasure. In a single-voltage device, a booster circuit is used to produce the high voltage, but the problem here is that when the supply voltage is reduced, the booster circuit must be made larger accordingly.

In the source erasure method, since a high potential is applied to the source, the source diffusion layer must be formed a greater depth to provide enough dielectric strength to sustain the high potential. This has impeded the effort to reduce the cell area.

Furthermore, for selective erasure, the circuit must be designed so that the source connection line (VSS line) can be set partially at a different potential. This requires line isolation and the addition of an extra drive circuit, and the chip size is increased accordingly.

To overcome these problems, there has been proposed a negative voltage application erasure method in which a negative voltage is applied to the control gate to allow a reduction in the positive voltage applied to the channel or source. This method is becoming a predominant method for erasure.

Usually, the negative voltage VBB to be applied to the control gate is set to about −10 V, and the supply voltage VCC of 5 V is applied to the channel or source.

The basic operation of the flash memory has been described above. Nonvolatile memories, such as flash memory, require a high-voltage power supply in addition to the conventional power supply; therefore, for circuits operating at high voltages, high-voltage transistors need to be fabricated in addition to normal-voltage transistors.

Depletion-mode transistors as well as enhancement-mode transistors are widely used in power supply circuits and the like. The above two types of transistor are distinguished from one another based on the presence or absence of the channel with zero gate bias. In an enhancement-mode device, no channel exists with zero gate bias; in a depletion-mode device, the channel exists with zero gate bias.

In the case of the depletion-mode transistor, however, since the channel is formed when no gate bias is applied, as described above, the control by the gate bias is complex compared with the enhancement-mode transistor. Therefore, circuit design is usually done based on enhancement-mode devices.

This does not, however, preclude the use of depletion-mode transistors from the circuit design; depending on applications, far more efficient circuit design may be done using depletion-mode devices rather than using enhancement-mode ones. Constant-voltage sources and signal switching devices (transfer gates) are specific examples.

Erasure of a flash memory is accomplished by drawing electrons from the floating gate into the channel or into the source by making use of the quantum tunnel effect. However, the current (tunneling current) caused by the electrons being drawn varies exponentially with the field strength between the floating gate and the channel or the source. As previously noted, for semiconductor devices including flash memories, the trend is toward lower supply voltages, and furthermore, increasing numbers of semiconductor devices are being designed for use with a single power supply. In the flash memory erasure methods using the negative voltage application method, the supply voltage VCC is directly applied to the channel or to the source. In the case of a semiconductor device designed for use with a 3-volt single power supply, for example, if this supply voltage were directly applied to the channel or to the source, the resulting field strength would be smaller than that with a 5-volt power supply. As described above, the field strength between the floating gate and the channel or the source greatly affects the tunneling current. To obtain the same erasure efficiency as in 5-volt devices, an electric field of the same strength as when a 5 V supply voltage is applied must be applied to the tunnel oxide film; if the 3 V supply voltage is applied to the channel or the source, a large negative voltage, which is large in terms of the absolute value, will have to be applied to the control gate. This means application of a large voltage to the oxide film of each transistor used in a booster circuit that generates the large negative voltage, which causes a problem in that it puts extra demands on the voltage withstanding characteristic (reliability) of the transistor.

In semiconductor devices, such as flash memories, that require high voltages, normal-voltage and high-voltage circuits are mixed in the same circuitry. Two kinds of transistors, i.e. 5-volt transistors and 12-volt transistors, are formed in a selective manner, the 12-volt devices being formed in only part of the whole integrated circuit. This, however, increases the complexity of processing and makes the fabrication more difficult.

As previously described, effective circuit design can be realized using depletion-mode transistors for such a power supply circuit as described above. To implement a depletion-mode transistor, a wafer process-like technique is usually used. That is, a large number of charges of the same polarity as the charges that form the channel are distributed in the channel region of a MOS transistor. For example, in the case of an n-channel depletion-mode transistor, the device is formed so that its channel region predominantly contains charges of negative polarity; conversely, a p-channel depletion-mode transistor is formed so that charges of positive polarity are predominant in its channel region. In practice, to provide the MOS transistor channel region with the above charge profile, p- or n-type impurities are ionized and accelerated by a field for injection into the channel region. This technique is generally called ion implantation.

Ion implantation is not only used for the formation of depletion-mode transistors, but the same technique is also used for forming n-channel and p-channel enhancement-mode transistors usually used as circuit elements. However, since enhancement-mode and depletion-mode devices require different charge distributions in the channel region, the charge distribution in the channel region is adjusted by varying the ion dose, the kind of ion implant, the field strength, etc. This means that the fabrication of deletion-mode transistors inevitably involves increased kinds of ion implants in the wafer processing steps. An increased number of processing steps causes such problems as increased complexity of the wafer process and increased time for process setup, leading finally to increased costs of the semiconductor devices.

SUMMARY OF THE INVENTION

In view of the above enumerated problems, it is a first object of the present invention to provide a nonvolatile semiconductor memory, designed to operate with a low-voltage, single power supply and employing a negative voltage erasure method, wherein large stress is prevented from being applied to the gate oxide film of each transistor used in a booster circuit that generates the negative voltage.

A second object of the invention is to provide a semiconductor device wherein a high-voltage circuit used in the nonvolatile semiconductor memory or the like is constructed using normal low-voltage transistors.

A third object of the invention is to enable transistors functionally equivalent to the depletion type used in a power supply circuit or the like to be fabricated by the usual fabrication process for enhancement-mode transistors.

The nonvolatile semiconductor memory according to the first mode of the invention is a semiconductor memory in which the stored data can be erased electrically, each storage element of the memory comprising a control gate, a floating gate, a source, and a drain, wherein for erasure a negative voltage generated by negative voltage generating means is applied to the control gate. To accomplish the first object, for erasure a voltage higher than the supply voltage is generated by erasure positive voltage generating means, and this erasure voltage is applied to the channel or to the source.

According to the constitution of the first mode, a higher voltage than the supply voltage is generated by the erasure positive voltage generating means and is applied to the channel or to the source for erasure, thus achieving high voltage application despite the low-voltage power supply. Therefore, the voltage to be applied to the control gate need not be increased in terms of absolute value. Since a large voltage is not applied to the transistor used in the negative voltage generating means, the problem of dielectric breakdown strength can be avoided.

The semiconductor device according to the second mode of the invention comprises a plurality of electrically isolated p-type wells, in at least two of which are formed one or more n-channel transistors, the source of each transistor being connected to the well in which it is formed. The n-channel transistors are connected in series with each other with the source of one transistor being connected to the drain of the next transistor. If more than one n-channel transistor is formed in the same well, the n-channel transistors in that well are first connected with each other and then connected to the n-channel transistor in the next well.

According to the constitution of the second mode, when a voltage is applied across the transistor array consisting of the plurality of series-connected n-channel transistors, the voltage is divided between the transistors and a small voltage is applied between the source and drain of each transistor. Since the source is connected to the well, the voltage applied between the well and the gate is also small, so that there is no need to increase the dielectric breakdown strength. In the prior art, since the well (or base) of each transistor was grounded, a large voltage was applied between the well (or base) and the gate even if a fraction of the total voltage was applied between the source and drain of each transistor.

The MOS transistor according to the third mode of the invention has a floating gate and is formed by an enhancement-mode device manufacturing process, the structure being such that a charge is injected into the floating gate and a channel is formed with zero bias application as in a depletion-mode device.

According to the constitution of the third mode, the MOS transistor formed is an enhancement-mode device but has a floating gate. The charge injected into the floating gate is retained there almost indefinitely, and the threshold voltage of the MOS transistor is determined by the type and amount of the injected charge. In the case of a p-channel MOS transistor, for example, injecting a negative charge into the floating gate results in a lower threshold voltage, and the channel is formed without requiring bias application. Such a transistor is a functional equivalent of a depletion-mode transistor, realizing in effect a depletion-mode transistor.

BRIEF DESCRIPTION OF THE DRAWINGS

The present invention will be more clearly understood from the description as set forth below with reference to the accompanying drawings, wherein:

FIGS. 34A to 34C are diagrams showing the structure of an eighth embodiment.

FIGS. 35A to 35D are diagrams showing the structure of a ninth embodiment.

DESCRIPTION OF THE PREFERRED EMBODIMENTS

Before proceeding to a detailed description of the preferred embodiments of the present invention, prior art non-volatile semiconductor memories will be described, with reference to the accompanying drawings relating thereto, for a clearer understanding of the differences between the prior art and the present invention.

Figure 1:
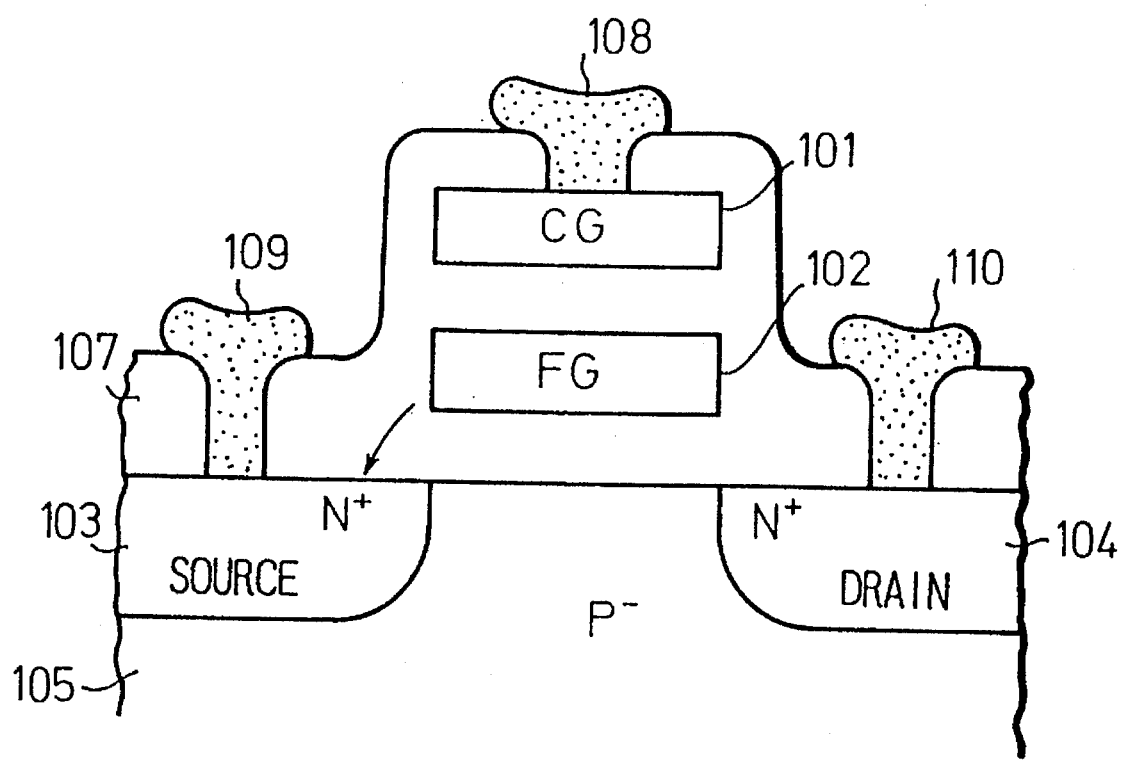
FIG. 1 is a diagram showing a transistor cell structure of a flash memory.

FIG. 1 is a diagram showing an example of a memory cell structure for the flash memory. As shown, the memory cell has a two-layered gate structure consisting of a control gate (CG) 101 and a floating gate (FG) 102, in which information storage is accomplished by utilizing the property that when prescribed voltages are applied to the control gate 101, drain (D) 104, and source (S) 103, the current flowing between the drain 104 and the source 103 varies depending on whether or not a charge is stored on the floating gate 102. Generally, in flash memories, the logic value "H" represents an erased state, i.e., the state in which no charge is stored on the floating gate 102, and the logic value "L" represents the state in which a charge is stored on the floating gate 102. Injecting a charge into the floating gate 102 is called writing.

Figure 2A:
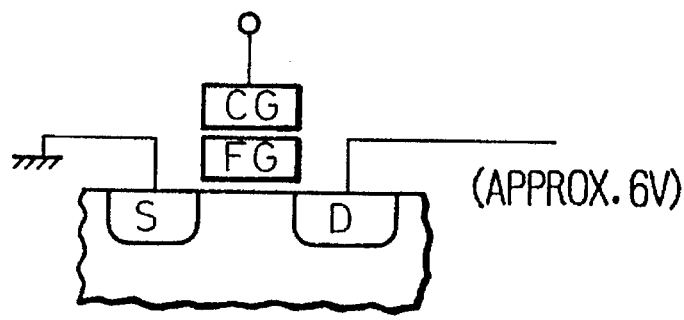
FIGS. 2A and 2B are diagrams for explaining read and write methods for the flash memory.
Figure 2B:
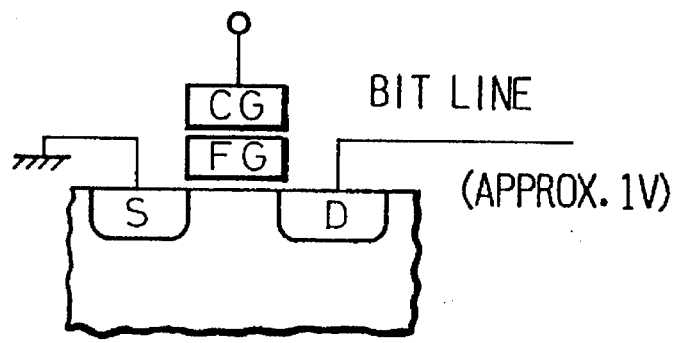

The following describes how information write, read, and erase operations are performed on the memory cell having the structure shown in FIG. 1. FIGS. 2A and 2B show the conditions of voltages applied to the various portions of the flash memory cell for information read and write operations: FIG. 2A for a write operation and FIG. 2B for a read operation.

For writing, a high voltage VPP (about 12 V) is applied to the control gate (CG), about 6 V applied to the drain (D), and 0 V applied to the source (S). Under these conditions, electrons flowing through the memory cell encounter a high electric field near the drain (D), and part of the electrons, accelerated by this field, gain enough energy to overcome the energy barrier of the gate insulating film and are injected into the floating gate (FG). Since the floating gate (FG) is electrically isolated from other circuit regions, the injected charge can be stored thereon semipermanently.

For reading, a supply voltage VCC (about 5 V) is applied to the control gate (CG), about 1 V applied to the drain (D), and 0 V applied to the source (S). The threshold voltage of the cell transistor varies depending on the presence or absence of charge on the floating gate (FG), so that the current flowing through the selected memory cell varies accordingly. By sensing and amplifying this current, the information is read out.

There are two main methods of erasure: one is the channel erasure method in which the charge stored on the floating gate 102 is drawn into the channel, i.e., into the substrate or a well, and the other is the source erasure method in which the charge is drawn into the source.

Figure 3:
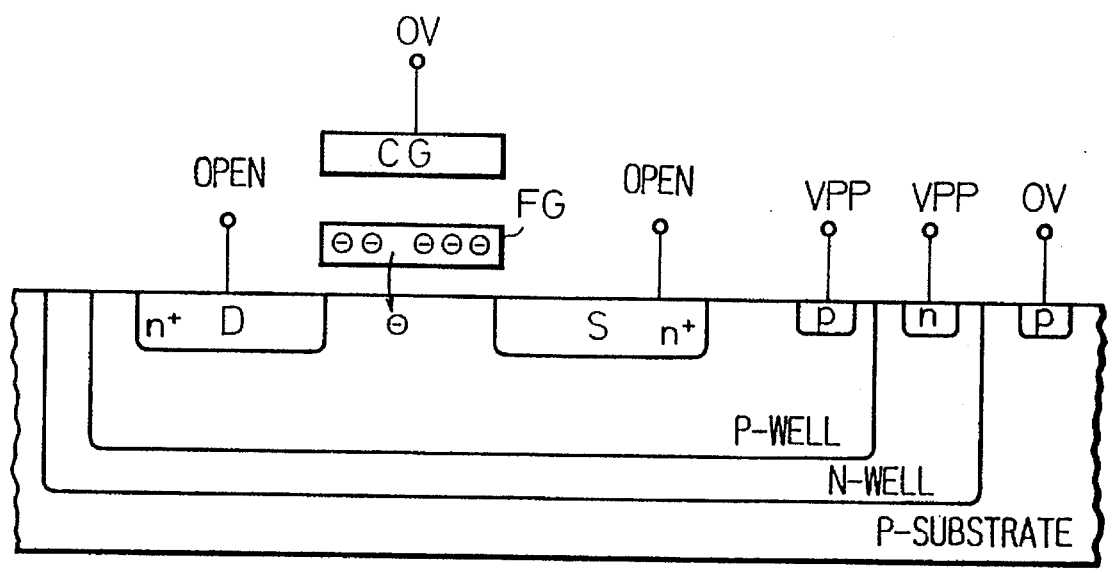
FIG. 3 is a diagram for explaining a channel erasure method utilizing high voltage application.
Figure 4:
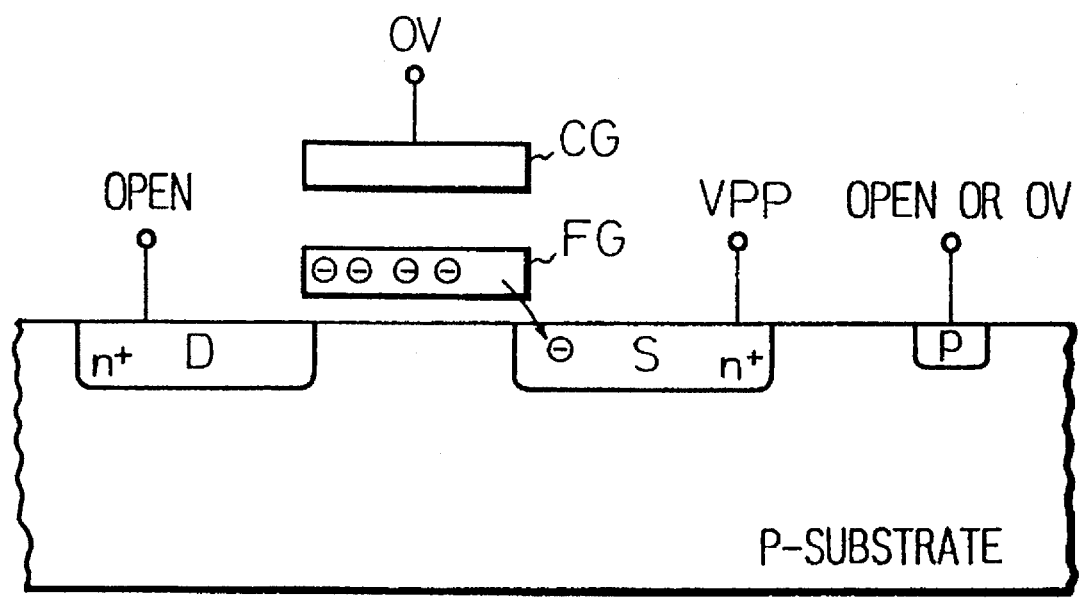
FIG. 4 is a diagram for explaining a source erasure method utilizing high voltage application.

FIG. 3 shows the conditions of voltages applied to the various portions when erasure is done by applying a high voltage to the channel, and FIG. 4 shows the conditions when erasure is done by applying a high voltage to the source.

As shown in FIG. 3, in channel erasure, 0 V is applied to the control gate CG, the drain D and source S are left open, and a high voltage VPP (about 12 V) is applied to the channel (p-well). This causes the charge stored on the floating gate FG to be drawn into the channel. In source erasure, as shown in FIG. 4, the high voltage VPP is applied to the source, and the channel (the substrate p-sub in the illustrated example) is left opened or connected to ground.

As described above, the recent trend for semiconductor devices has been toward lower supply voltages, and the reduction of supply voltages has also been pushed forward for flash memories. The lower voltage design also requires the reduction of the high voltage applied to the channel or source for erasure. In a single-voltage device, a booster circuit is used to produce the high voltage, but the problem here is that when the supply voltage is reduced, the booster circuit must be made larger accordingly.

In the source erasure method, since a high potential is applied to the source S, the source diffusion layer must be formed a greater depth to provide enough dielectric strength to sustain the high potential. This impedes the effort to reduce the cell area.

Furthermore, for selective erasure, the circuit must be designed so that the source connection line (VSS line) can be set partially at a different potential. This requires the line isolation and the addition of an extra drive circuit, and the chip size is increased accordingly.

To overcome these problems, there has been proposed a negative voltage application erasure method in which a negative voltage is applied to the control gate CG to allow a reduction in the positive voltage applied to the channel or source. This method is becoming a predominant method for erasure.

Figure 5:
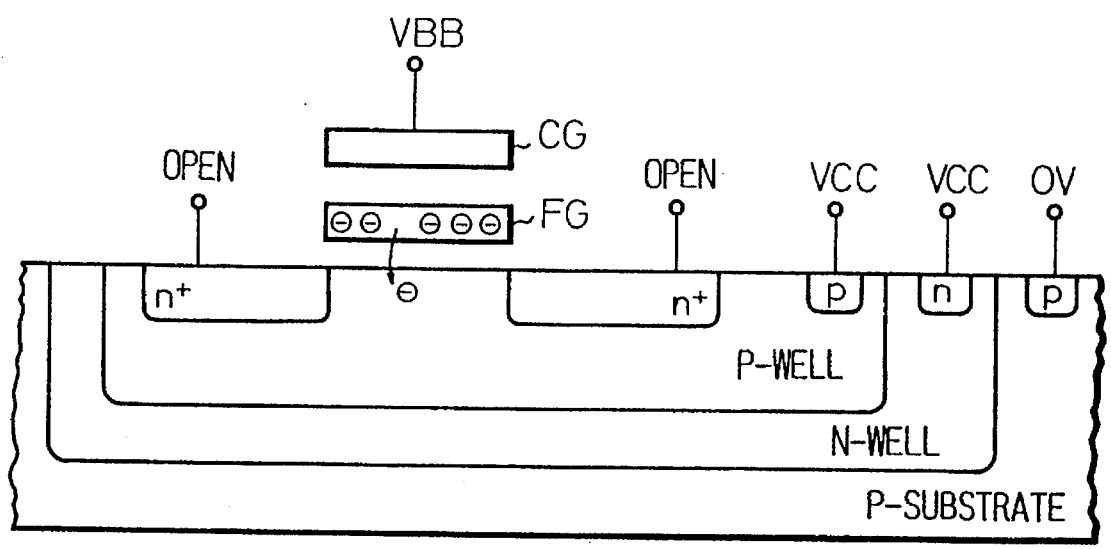
FIG. 5 is a diagram for explaining a channel erasure method utilizing a negative voltage application method wherein a negative voltage is applied to the control gate.
Figure 6:
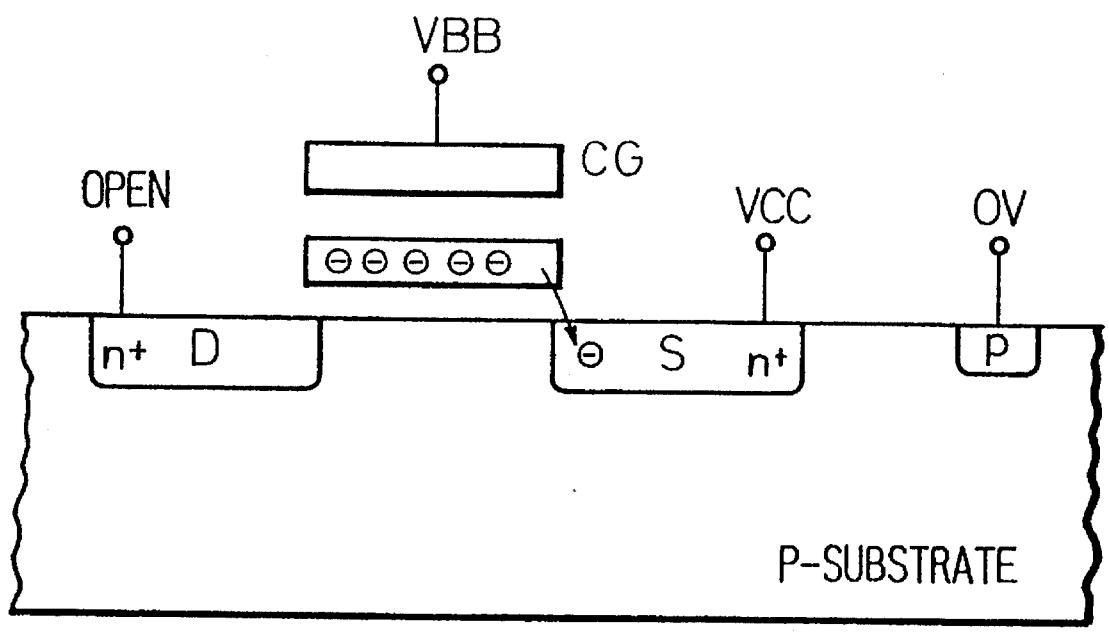
FIG. 6 is a diagram for explaining a source erasure method utilizing the negative voltage application method.

FIGS. 5 and 6 are diagrams showing the conditions for channel erasure and source erasure, respectively, utilizing the negative voltage application method. Usually, the negative voltage VBB to be applied to the control gate CG is set to about −10 V, and the supply voltage VCC of 5 V is applied to the channel or source.

Erasure of a flash memory is accomplished by drawing electrons from the floating gate into the channel or into the source by making use of the quantum tunnel effect. However, the current (tunneling current) caused by the electrons being drawn varies exponentially with the field strength between the floating gate and the channel or the source. As previously noted, for semiconductor devices including flash memories, the trend is toward lower supply voltages, and furthermore, increasing numbers of semiconductor devices are being designed for use with a single power supply. In the flash memory erasure methods using the negative voltage application method, as shown in FIGS. 5 and 6, the supply voltage VCC is directly applied to the channel or to the source. In the case of a semiconductor device designed for use with a 3-volt single power supply, for example, if this supply voltage were directly applied to the channel or to the source, the resulting field strength would be smaller than that with a 5-volt power supply. As described above, the field strength between the floating gate and the channel or the source greatly affects the tunneling current. To obtain the same erasure efficiency as in 5-volt devices, an electric field of the same strength as when a 5 V supply voltage is applied must be applied to the tunnel oxide film; if the 3 V supply voltage is applied to the channel or the source, a large negative voltage, which is large in terms of the absolute value, will have to be applied to the control gate. This means application of a large voltage to the oxide film of each transistor used in a booster circuit that generates the large negative voltage, which causes a problem in that it puts extra demands on the voltage withstanding characteristic (reliability) of the transistor.

Figure 7:
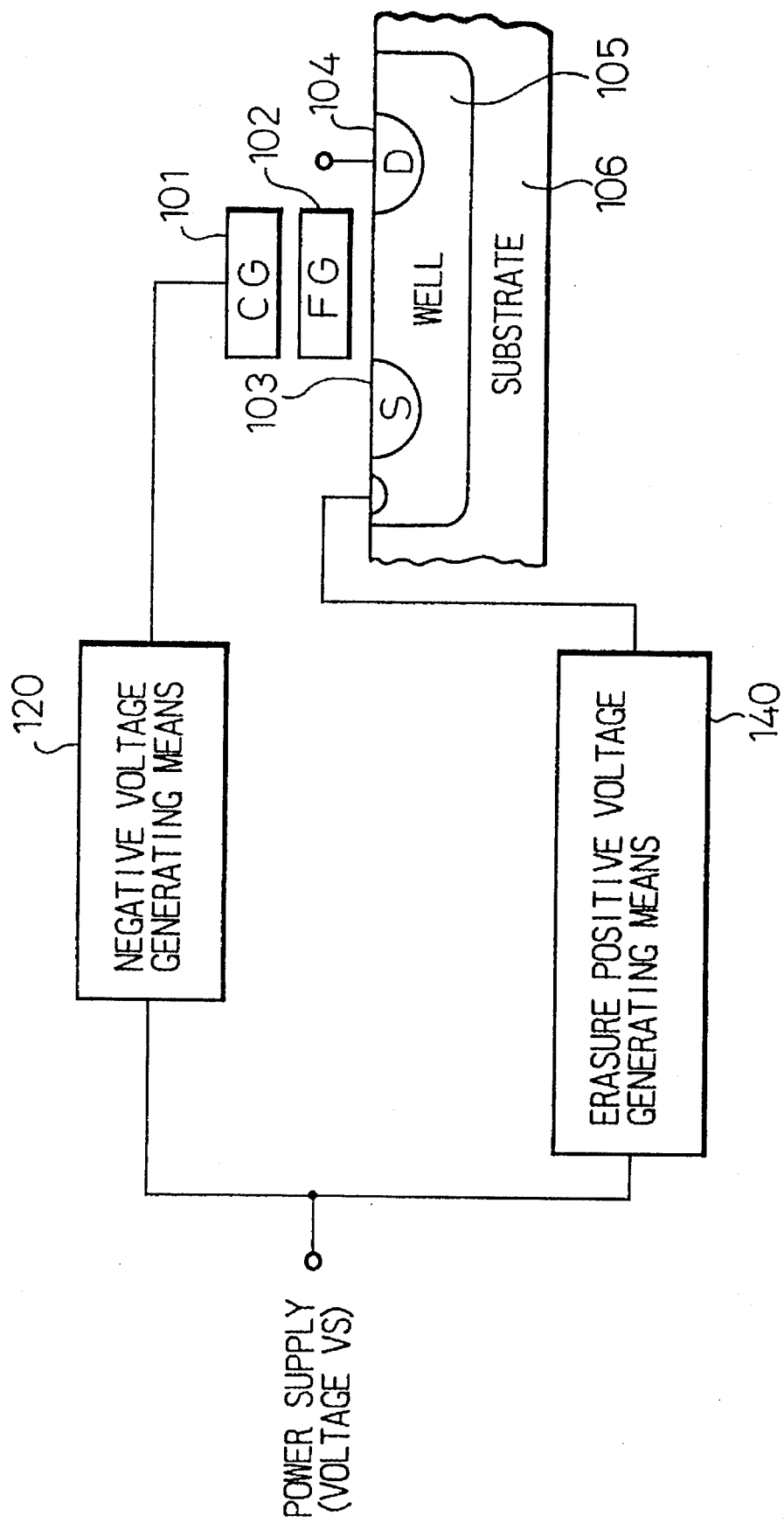
FIG. 7 is a diagram showing one basic functional constitution of a first mode of the invention.
Figure 8:
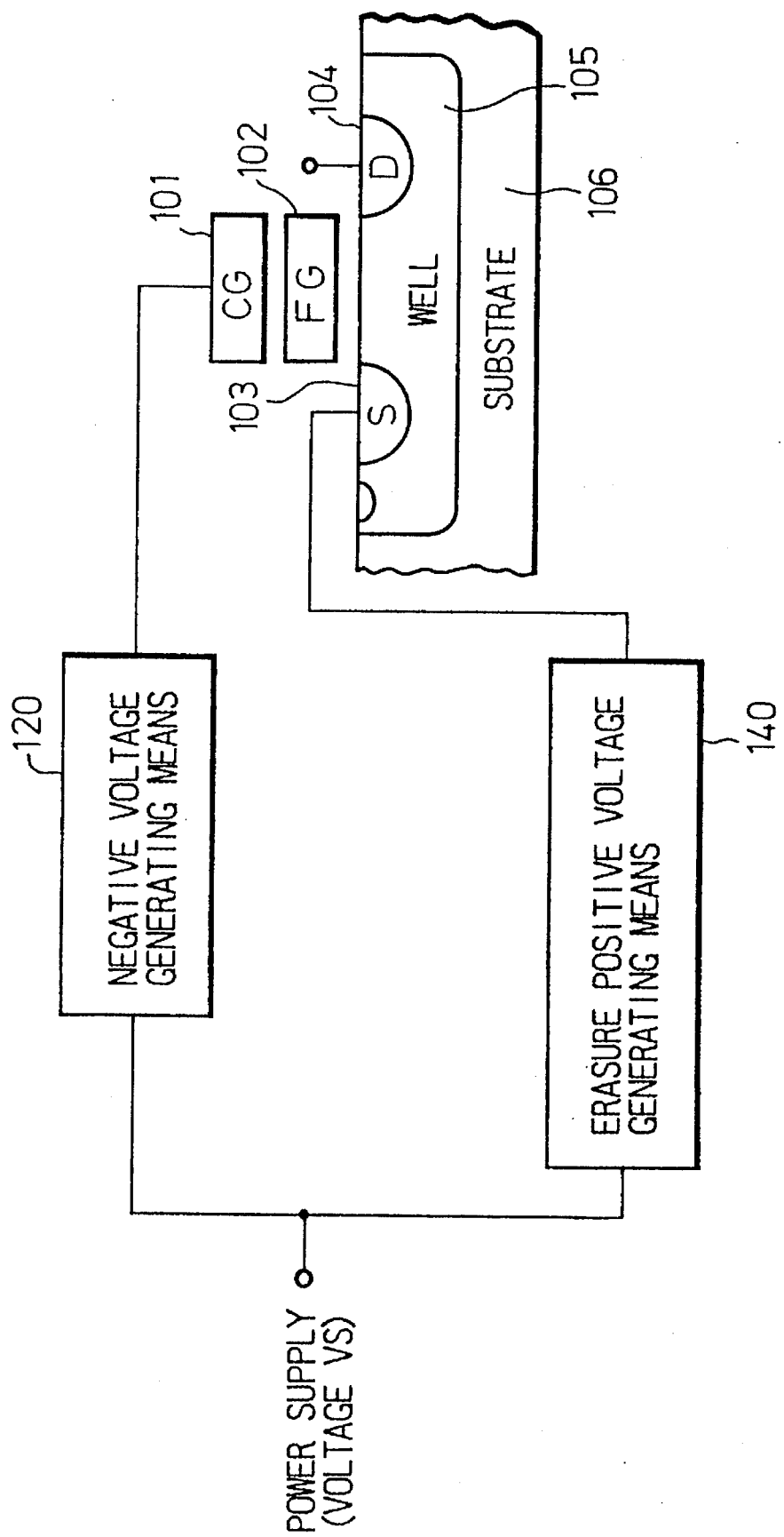
FIG. 8 is a diagram showing the other basic functional constitution of a first mode of the invention.

FIGS. 7 and 8 are diagrams showing the basic functional configuration of a first mode of the present invention as set forth in claims 1 and 2, which accomplishes the first object.

As shown in FIGS. 7 and 8, the nonvolatile semiconductor memory according to the first mode of the invention is a semiconductor memory in which the stored data can be erased electrically, each storage element of the memory comprising a control gate (CG) 101, a floating gate (FG) 102, a source (S) 103, and a drain (D) 104, wherein for erasure a negative voltage generated by negative voltage generating means 120 is applied to the control gate (CG) 101. To accomplish the first object, for erasure a voltage higher than the supply voltage is generated by positive erasure voltage generating means 140, and this erasure voltage is applied to the channel or to the source 103.

According to the configuration of the first mode, a voltage higher than the supply voltage is generated by the positive erasure voltage generating means 140 and applied to the channel or to the source 103 for erasure, thus achieving high voltage application despite the low-voltage power supply. Therefore, the voltage to be applied to the control gate 101 need not be increased in terms of absolute value. Since a large voltage is not applied to the transistor used in the negative voltage generating means 120, the problem of dielectric breakdown strength can be avoided.

Figure 9:
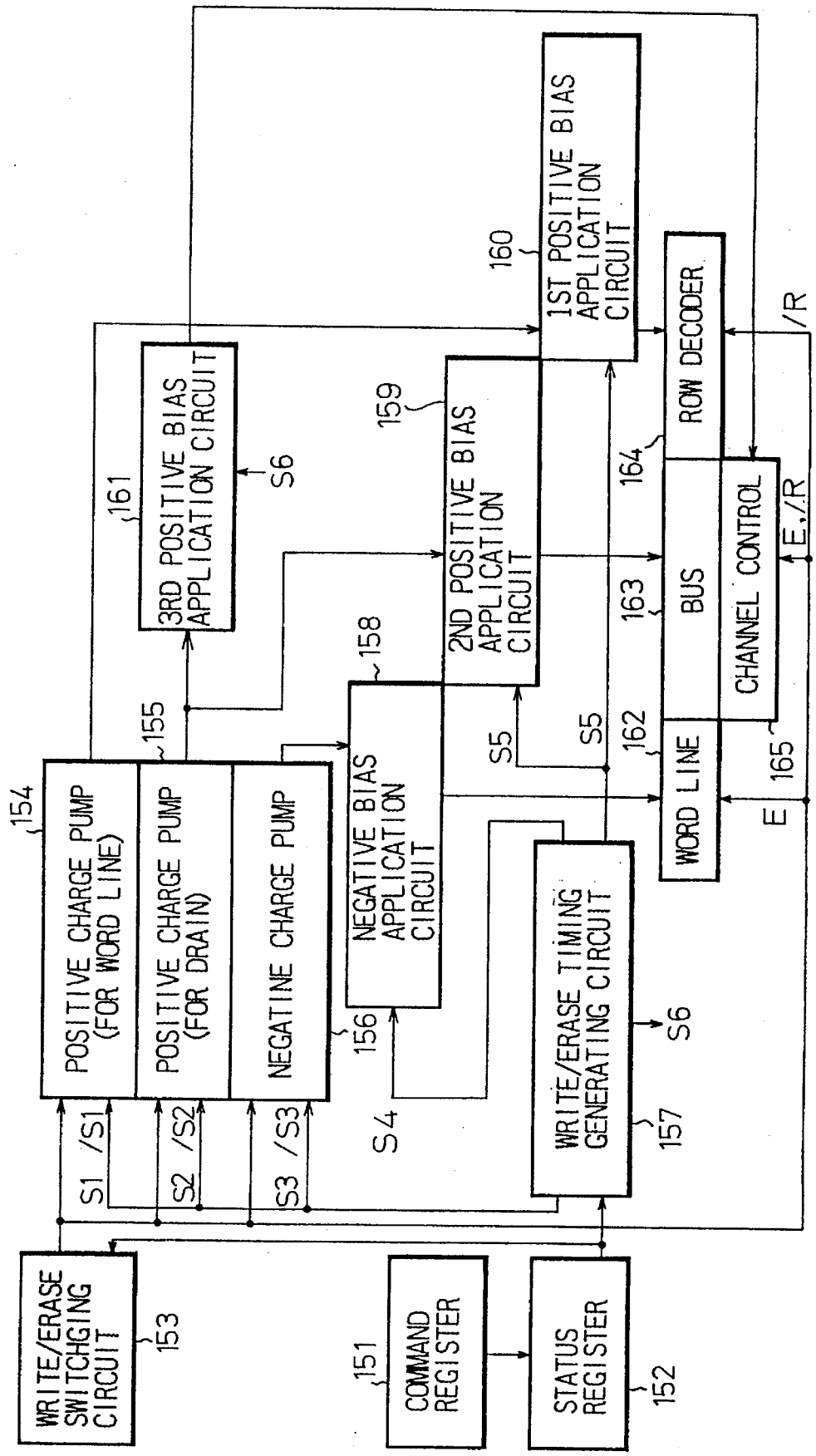
FIG. 9 is a block diagram showing the constitution of a first embodiment.
Figure 10:
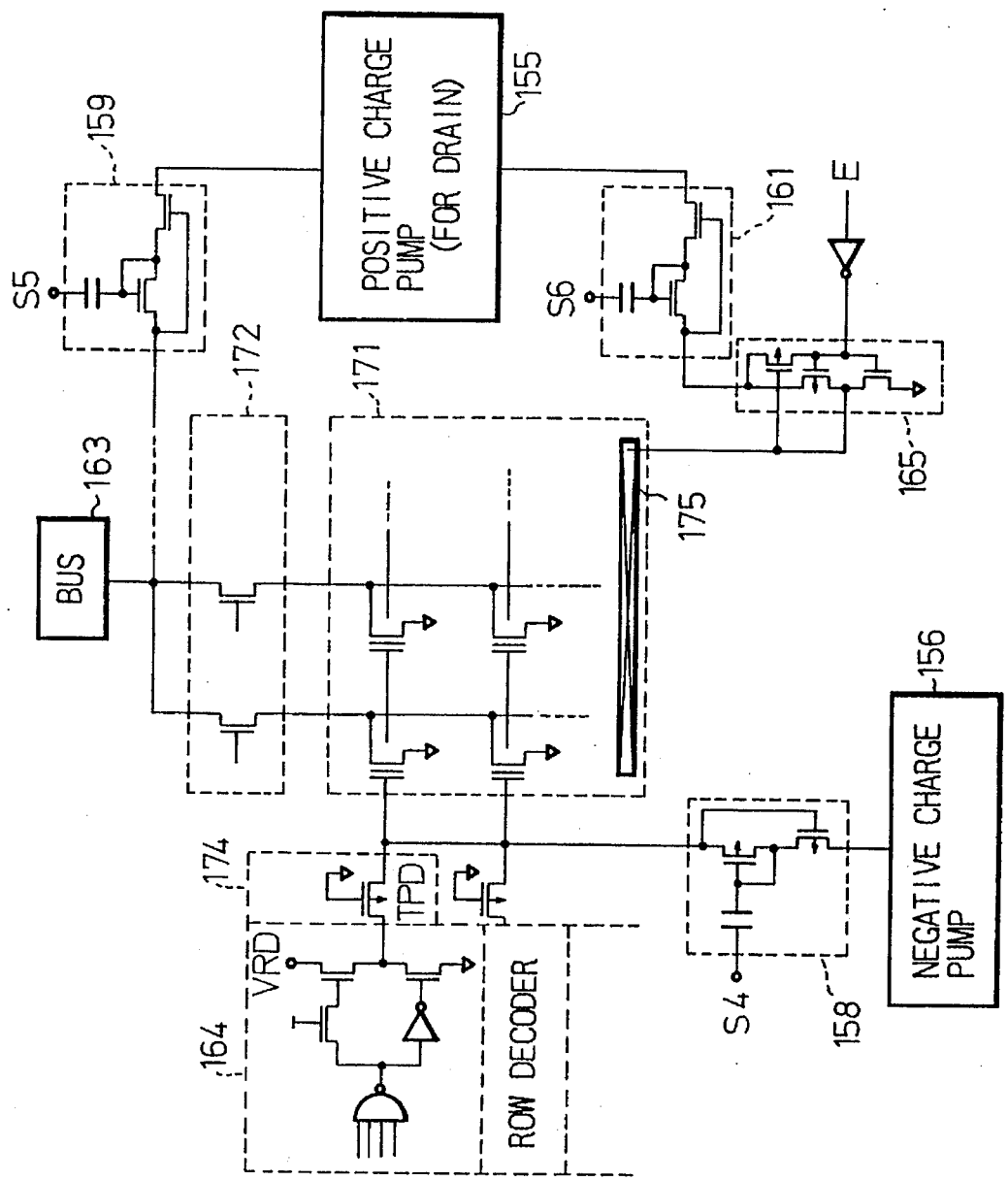
FIG. 10 is a diagram showing the circuit constitution of a negative-voltage charge pump circuit of the first embodiment.
Figure 11:
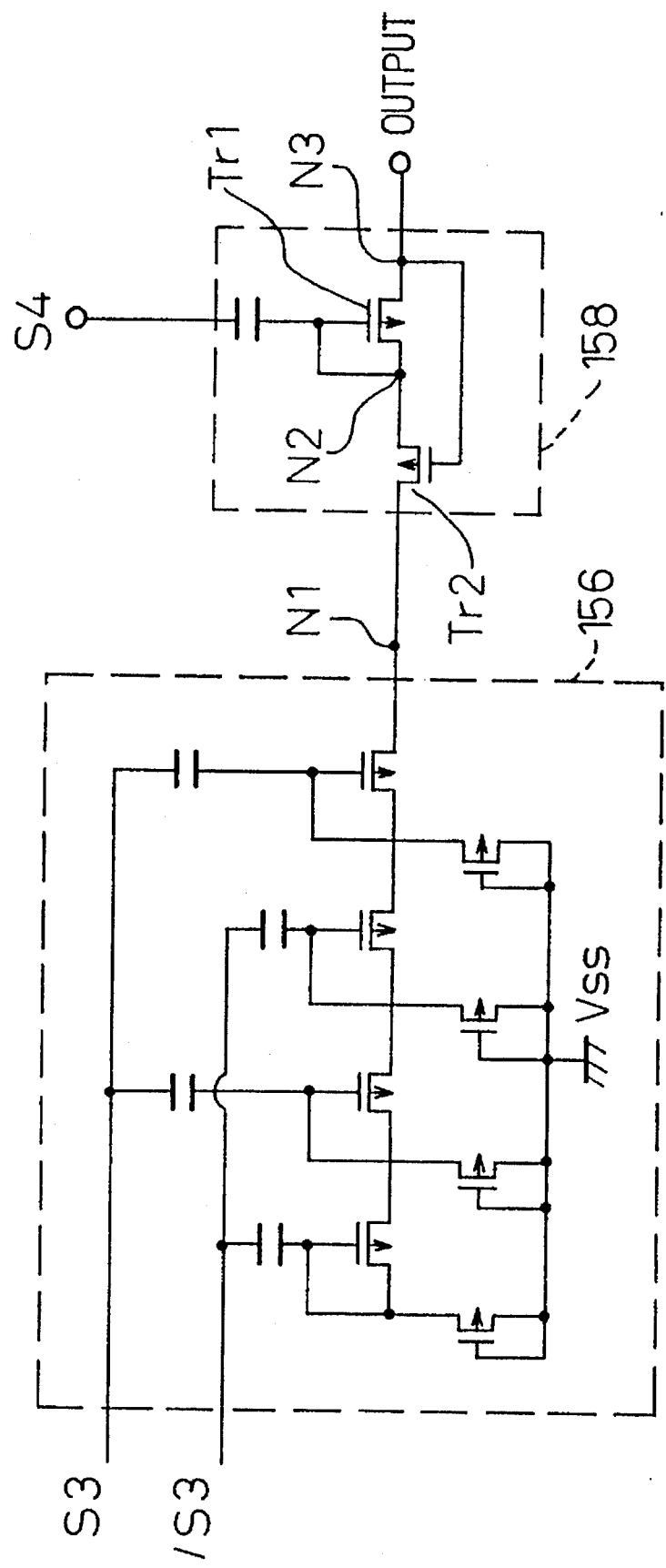
FIG. 11 is a circuit diagram showing a negative charge pump and a negative bias application circuit.
Figure 12:
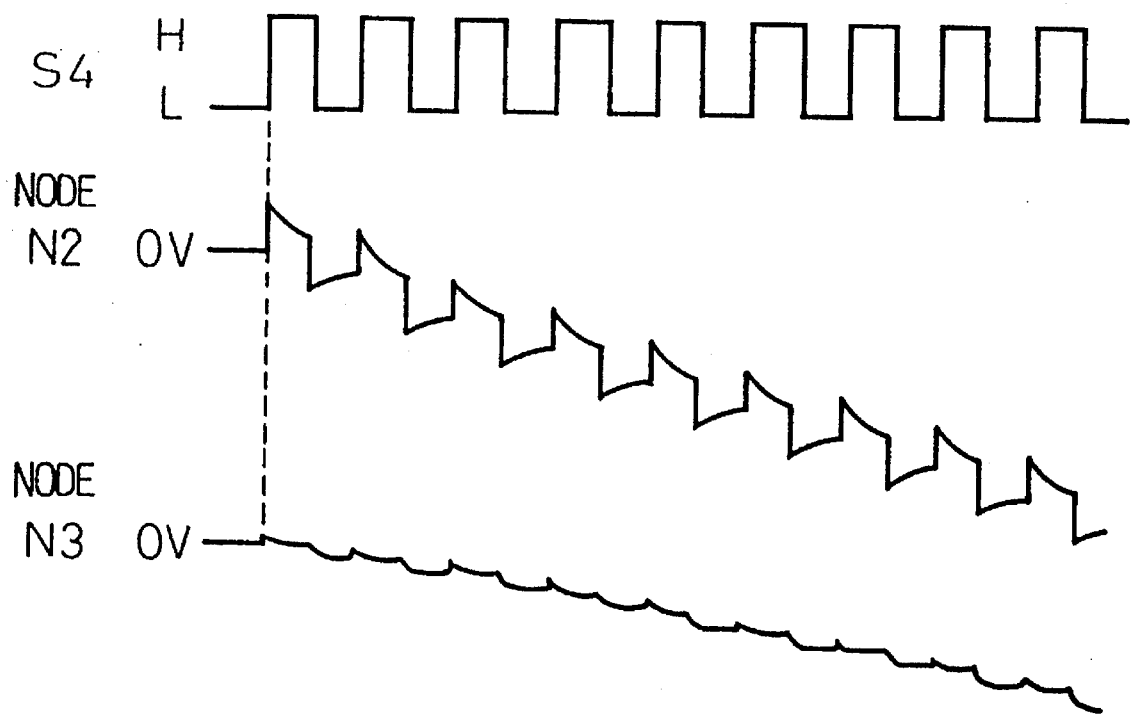
FIG. 12 is a time chart showing a signal applied to the negative bias application circuit and voltage changes of some nodes of the negative bias application circuit.
Figure 13:
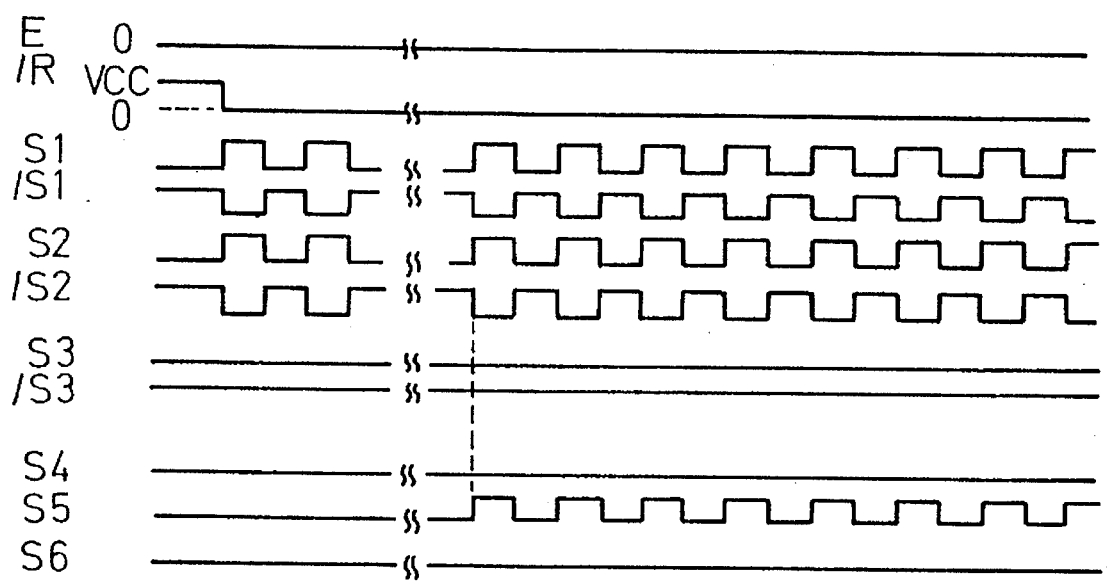
FIG. 13 is a time chart showing timing signals for writing of the first embodiment.
Figure 14:
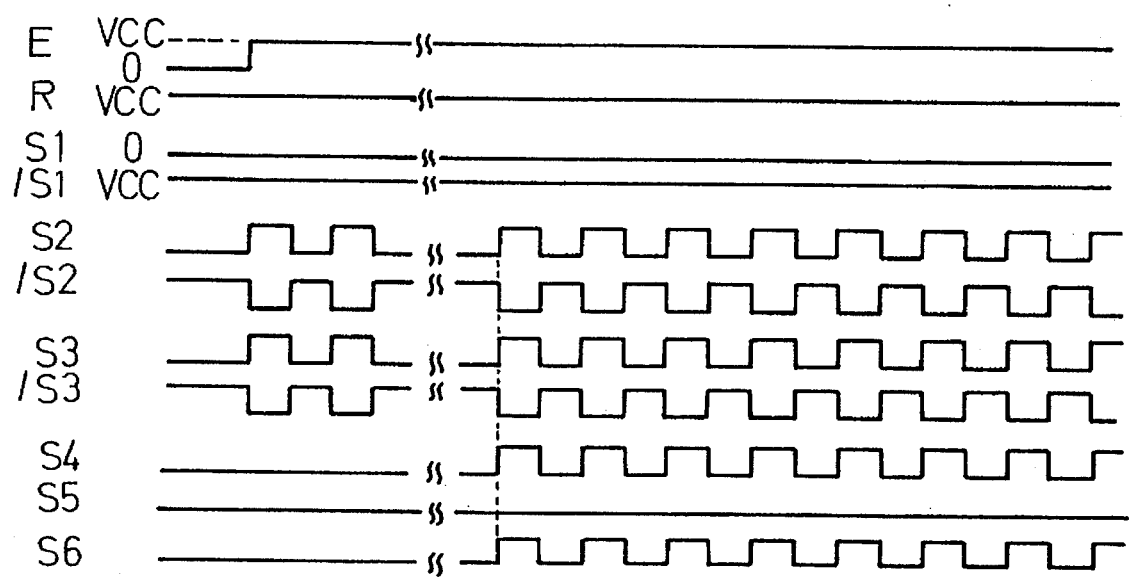
FIG. 14 is a time chart showing timing signals for erasure of the first embodiment.
Figure 15:
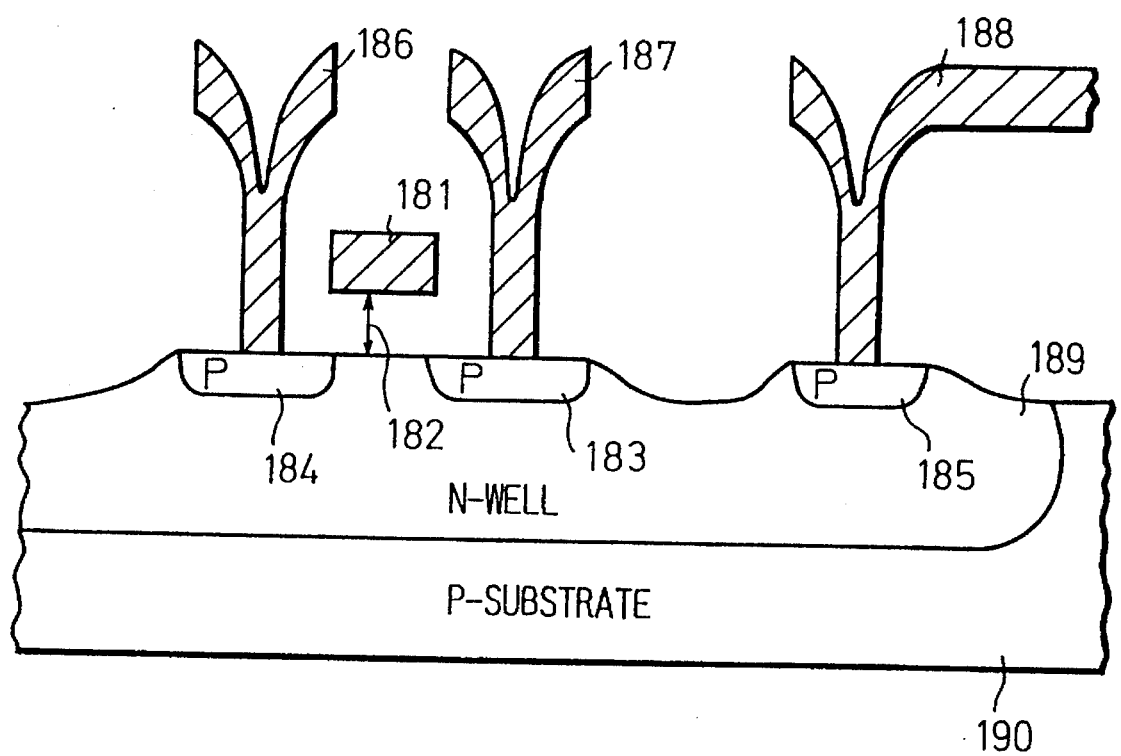
FIG. 15 is a diagram showing a cross-sectional structure of a negative bias application circuit in the first embodiment.

FIG. 9 is a block diagram showing the configuration of a power supply system used for writing and erasure of a flash memory according to a first embodiment; FIG. 10 is a circuit diagram showing a portion of FIG. 9 in more detail; FIG. 11 is a circuit diagram showing a negative-voltage charge pump 156 and a negative bias application circuit 158 of FIGS. 9 and 10; FIG. 12 shows waveforms for explaining the operations of a negative bias application circuit; FIGS. 13 and 14 are timing charts for the signals shown in FIGS. 9 and 10; and FIG. 15 is a diagram showing a cross-sectional structure of a negative bias application circuit.

In FIG. 9, the numeral 151 indicates a command register, 152 indicates a status register, 153 indicates a write/erase switching circuit, and 157 indicates a write/erase timing generating circuit. Flash memories, in general, are constructed so that the write/erase operations and verify operations subsequent thereto are automatically performed just by issuing a command. By an external command signal, data Stored in the command register 151 is output and fed to the status register 152, in accordance with which data the write/erase switching circuit switches the various elements into the ready state for a write or erase operation, and the write/erase timing generating circuit supplies control signals, E, /R, and S1–S6, to the various elements to perform the specified operation. These control signals are shown in FIG. 6 for write and erase operations, respectively.

To generate voltages larger than the supply voltage in terms of absolute value, necessary for the write and erase operations, a word line positive charge pump a drain positive charge pump 155, and a negative charge pump 156 are provided. The word line positive charge pump 154 is a circuit that generates a high voltage of the order of 12 V for application to the word line to which the control gate of the cell selected for writing is connected. This voltage is applied to a row decoder 164 via a first positive bias application circuit 160. The negative charge pump 156 is a circuit that generates a negative voltage of the order of −10 V for application to a word line 162 during an erase operation. This voltage is applied to the word line via a negative bias application circuit 158. The drain positive charge pump 155 is a circuit that generates a positive voltage of the order of 6 V for application to the drain during a write operation. This voltage is applied via a second positive bias application circuit 159 and a common bus 163 to the bit line to which the cell to be written into is connected. In this embodiment, the drain positive charge pump 155 is used as a booster circuit to generate a voltage applied to the channel for erasure. Therefore, during an erase operation, the positive voltage output from the drain positive charge pump 155 is applied to an erasure channel control 165 via a third positive bias application circuit.

FIG. 10 is a diagram showing a portion of the circuit of this embodiment in more detail. The reference numerals correspond to those used in FIG. 9. The numeral 171 indicates a matrix array of memory cells, and 175 indicates a well. The numeral 172 indicates a switch array interposed between the bit lines and the common bus line 163. The numeral 174 indicates a gate circuit which is interposed between a word line and the row decoder 164 and which automatically works to disconnect the row decoder 164 from the word line when the negative voltage is applied to the word line via the negative bias circuit 158 during an erase operation. The high voltage from the first positive bias circuit is applied to a power supply terminal VRD of the row decoder 164.

FIG. 11 is a circuit diagram showing the negative-voltage charge pump 156 and the negative bias application circuit 158. The positive-voltage charge pump 155 and the positive bias application circuits 159, 161 have constitutions the same as those of FIG. 11 except that p-channel transistors of FIG. 11 are replaced with n-channel transistors. This charge pump circuit is a well-known booster circuit, which respectively outputs prescribed voltages in response to complementary clock signal inputs S3 and /S3. S1, /S1, S2, /S2, and S3, /S3 are the complementary clock signal pairs which are supplied from the write/erase timing generating circuit 157 to the word line positive charge pump 154, drain positive charge pump 155, and negative charge pump 156, respectively.

S4 to S6 are the clock signals which are supplied to the respective bias application circuits 158, 159, and 161. The negative bias application circuit 158 is composed of two p-channel transistors and a capacitor. During negative-voltage output, the clock Signal S4 is fed to one terminal of the capacitor. In the following, the operation of the negative bias application circuit 158 is explained.

Waveforms shown in FIG. 12 show the operation of the negative bias application circuit 158. When the clock signal S4 shown in FIG. 12 is applied to the terminal of the capacitor, the levels at nodes N2 and N3 vary as shown in FIG. 12.

When the clock signal S4 applied to the capacitor reverses in polarity from positive to negative, the level at node N2 drops due to capacitive coupling. As a result, the p-channel transistor Tr1 is turned on. Charges then move from the node N3 to the node N2 until the level at the node N2 equals the level at the node N3.

When the clock signal S4 reverses in polarity from negative to positive, the level at node N2 rises due to capacitive coupling. As a result, the p-channel transistor Tr1 is turned off and the p-channel transistor Tr2 is turned on. Charges then move from the node N2 onto the node N1 until the difference in level between the node N1 and the node N2 becomes equal to the threshold voltage of the p-channel transistor Tr2. When the above operation is repeated, the negative voltage output from the negative-voltage charge pump circuit 156 is induced in the node N3.

Next, the operation of this embodiment will be described with reference to FIGS. 13 and 14.

In a read operation, S4–S6 are fixed to either "H" or "L". All the charge pumps are put in the deenergized state. The supply voltage VCC is applied via VRD to the row decoder 164, and the word line is connected to VCC or to ground voltage VSS according to whether it is in the select or the deselect state.

In a write operation, S4 and S6 are fixed to either "H" or "L", and a clock signal is supplied as signal as shown in FIG. 13. Since the levels of S3 and /S3 are fixed, the negative charge pump remains deenergized; on the other hand, since clock signals are supplied as S1, /S3 and S2, /S2, both positive charge pumps 154 and 155 are put in an operating state. As a result, the high voltage is fed to the terminal VRD, so that the word line selected by the row decoder 164 rises to the high voltage while the other word lines remain at 0 V. The positive voltage from the drain positive charge pump 155 is supplied via the second positive bias circuit 159 to the common bus line 163; this positive voltage is applied to the bit line selected by the column decoder.

Since the sources of all the memory cells are grounded, the high voltage is applied to the control gate of the memory cell selected by the address signal and the positive voltage is applied to its drain, with its source and channel grounded, thus accomplishing the writing.

In an erase operation, as shown in FIG. 14, S5 is fixed, and clock signals are supplied as S4 and S6 so that the drain positive charge pump 155 and the negative charge pump 156 are put in an operating state.

As a result, the negative voltage from the negative charge pump 156 is applied via the negative bias circuit 158 to the word line, and the positive voltage from the drain positive charge pump 155 is applied to the well 175 via the third positive bias circuit 161 and via the channel control 165, thus accomplishing the erasure.

As described, according to the first embodiment, since the positive voltage is applied to the well 175 during an erasure operation, an electric field necessary for erasure can be applied to the tunnel oxide film by applying the negative voltage of the same magnitude as in a previous device to the word line. It is therefore not necessary to supply a negative voltage of a large absolute value to the word line.

In the first embodiment, the positive erasure voltage is applied to the well for erasure. On the other hand, if the positive voltage is applied to the source using the same circuit, source erasure can be accomplished.

FIG. 15 is a diagram showing a cross-sectional structure of the negative bias application circuit 158, wherein 181 indicates a polysilicon gate, 182 indicates a gate oxide film, 183 and 184 indicate diffused layers, 185 indicates a well contact, 186 to 188 indicate aluminum connections, 189 indicates an n-well, and 190 indicates a p-substrate. The following describes how the thickness of the gate oxide film 182 is improved by the present invention.

Suppose here that the coupling coefficient of the flash memory is 0.5, the thickness of the tunnel oxide film is 100 and the electric field between the floating gate or channel, necessary for erasure, is 100 MV/cm. When the supply voltage is 5 V, if this voltage is to be applied to the well or source for erasure, a voltage of −10 V will have to be applied to the control gate to achieve the above condition. In FIG. 15, if the potential of the well 189 is at 0 V, the gate oxide film 182 will be subjected to a maximum voltage of 10 V. If the maximum stress field of the transistor of FIG. 15 is 3 MV/cm, the gate oxide film will be required to have a thickness of not less than 350.

On the other hand, if a boosted voltage of 7 V is applied to the channel or source of the flash memory cell, the control gate need only be supplied with −6 V. Accordingly, the thickness of the gate oxide film 182 of FIG. 15 can be reduced to 200 to 250.

Thus, in the present invention, since no large stress is applied to the gate film of each transistor used in the negative charge pump and negative bias circuit, there is no need to form special high-voltage transistors, and thus, the device reliability is improved. Furthermore, as is apparent from the description given so far, the charge pump for generating the positive voltage applied to the drain for writing can also be used as the charge pump for generating the positive voltage applied to the channel or source for erasure; therefore, no increase in the circuit size is required.

As described above, according to the first mode of the invention, since there is no need to apply a negative voltage of a large absolute value to the cell control gate for erasure, large stress is not applied to the gate oxide film of each transistor used in the booster circuit provided to generate the negative voltage, the effect being that special high-voltage transistors need not be formed so that the device reliability is increased.

Figure 16:
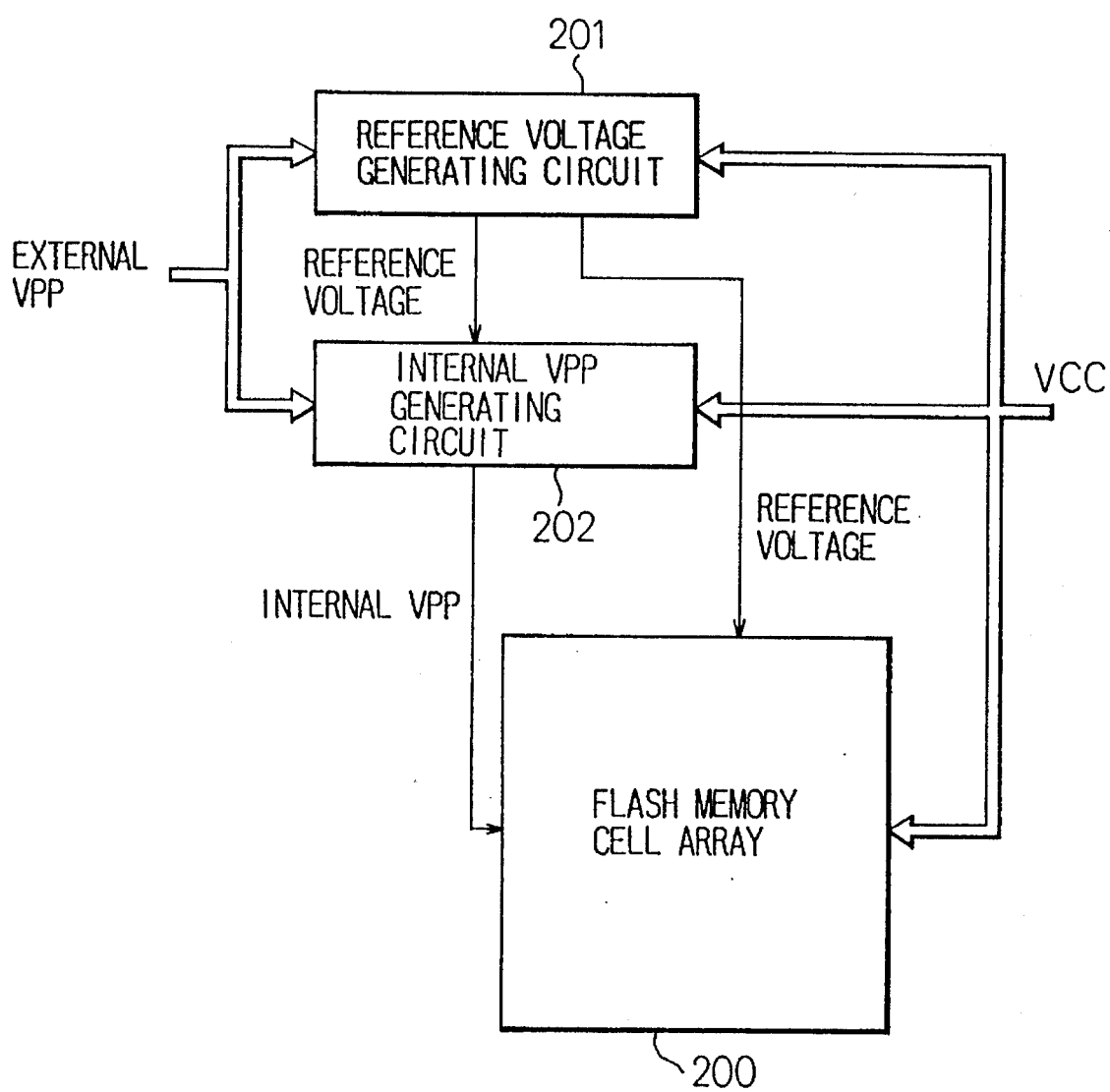
FIG. 16 is a diagram showing a portion where a second embodiment is applied.

FIG. 16 is a diagram showing an example of a portion where the circuits of the second to fourth embodiments hereinafter described are applied. In flash memory, the voltage needs to be switched to the appropriate level for application to each portion, as described above; furthermore, after a write or erase operation, a verify operation is performed to verify whether the write or erase operation has been accomplished correctly, by performing a read operation using a different reference level. The second to fourth embodiments are suitable for such a voltage switching circuit and a reference voltage generating circuit for a flash memory. However, they are not limited to these applications but are also effective for any device that partly uses a high voltage.

Before proceeding to a detailed description of the second to fourth embodiments, a prior art level change circuit will be described for a clearer understanding of the differences between the prior art and the present invention.

Figure 17:
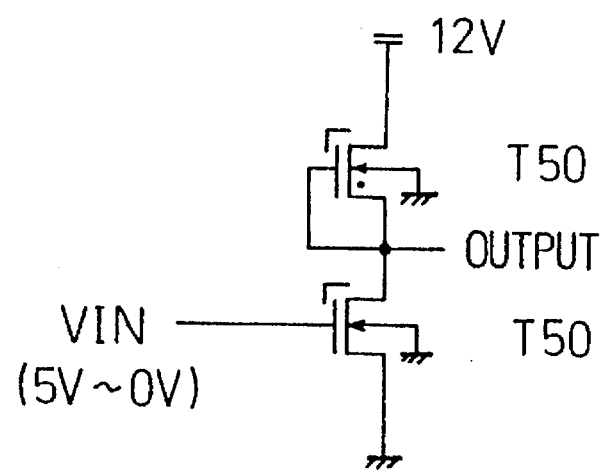
FIG. 17 is a diagram showing a prior art level conversion circuit.

FIG. 17, for example, shows a prior art level conversion circuit for converting the voltage level from 5 to 12 V. since 12 V is applied between drain and source and between gate and bulk of a depletion-mode transistor TD50 and an enhancement-mode transistor T50, the gate film thickness and gate length are increased to increase the dielectric breakdown strength of the transistors.

Figure 18:
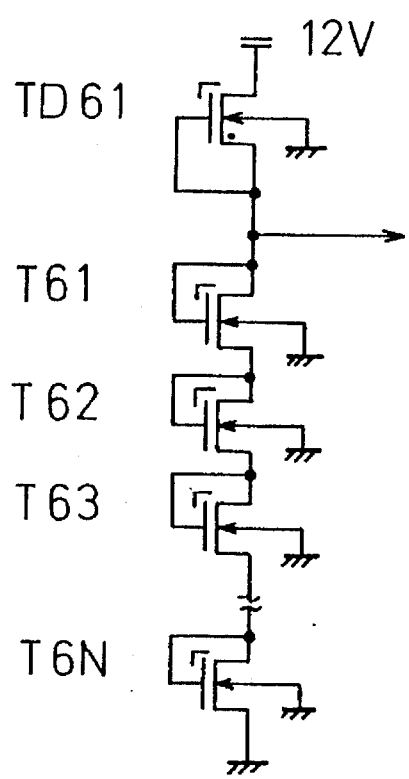
FIG. 18 is a diagram showing a prior art constant-voltage generating circuit.

FIG. 18 shows a constant-voltage generating circuit that utilizes a voltage drop through several stages of the transistor threshold voltage Vth. This circuit construction is widely used as it produces a constant voltage independent of the supply voltage. The circuit of FIG. 18 uses a power supply of 12 V, and 12-volt transistors are used as in the case of the circuit of FIG. 17. This means application of a large voltage to the oxide film of each transistor used in a booster circuit that generates the large negative voltage, which causes a problem in that it puts extra demands on the voltage withstanding characteristic (reliability) of the transistor.

In semiconductor devices, such as flash memories, that require high voltages, normal-voltage and high-voltage circuits are mixed in the same circuitry. Two kinds of transistors, i.e., 5-volt transistors and 12-volt transistors, are formed in a selective manner, the 12-volt devices being formed in only part of the whole integrated circuit. This, however, increases the complexity of processing and makes the fabrication more difficult.

Referring to the circuit of FIG. 18, the transistors are formed on the same substrate (wafer), so that the back bias is larger for the upper-stage transistors (T62, T63, . . . ), thus increasing their threshold voltages. When the increase in threshold voltage due to the back bias effect is denoted by V1, V2, . . . , for T61, T62, . . . , respectively, and the threshold value with 0 V back bias is denoted by Vth, then Vout=n×Vth+V1+V2 . . . , which shows the problem that Vout varies greatly depending on the bias characteristic. Since the back bias characteristic varies from process to process, the problem is that it is difficult to obtain an accurate voltage because of processing constraints.

In the circuits described in the second to fourth embodiments, these problems are dissolved.

Figure 19A:
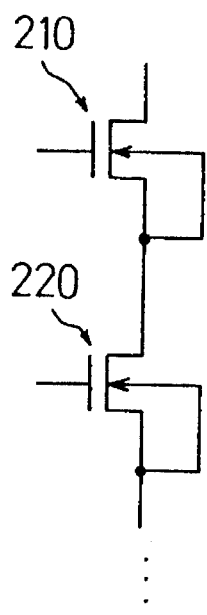
FIGS. 19A and 19B are diagrams showing a basic functional constitution of a second mode of the invention.
Figure 19B:
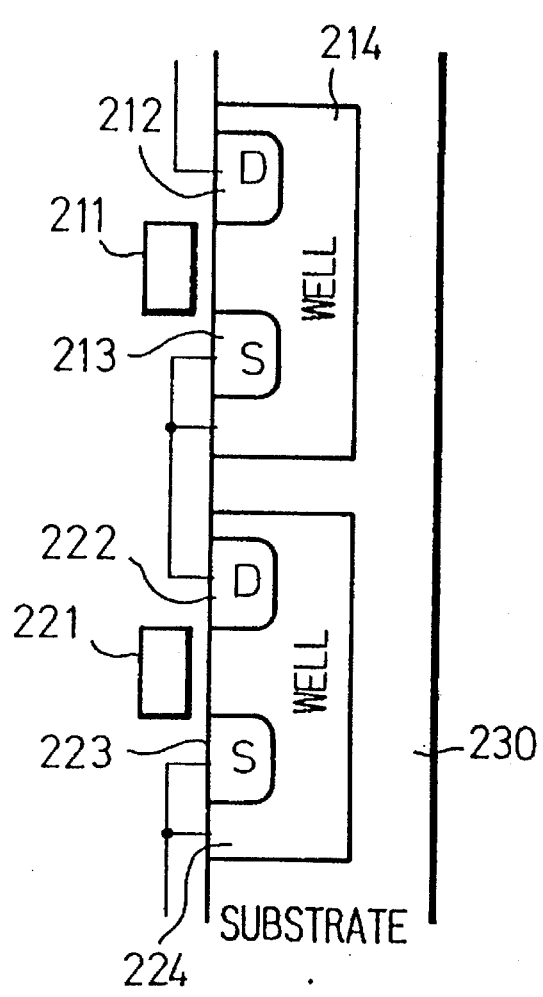

FIGS. 19A and 19B are diagrams showing the basic functional configuration of a second mode of the present invention. FIG. 19A is a diagram showing a portion of a semiconductor device according to the second mode, and FIG. 19B is a diagram showing an equivalent circuit of FIG. 19A.

As shown in FIG. 19A, the semiconductor device according to the second mode of the invention comprises a plurality of electrically isolated p-type wells, 214, 224, . . . , in at least two of which are formed one or more n-channel transistors (one in each well in the illustrated example), 210, 220, . . . , the source of each transistor being connected to the well in which it is formed. The n-channel transistors are connected in series with each other with the source of one transistor being connected to the drain of the next transistor. If more than one n-channel transistor is formed in the same well, the n-channel transistors in that well are first connected with each other and then connected to the n-channel transistor in the next well.

According to the configuration of the second mode, when a voltage is applied across the transistor array consisting of the plurality of series-connected n-channel transistors, the voltage is divided between the transistors and a small voltage is applied between the source and drain of each transistor. Since the source is connected to the well, the voltage applied between the well and the gate is also small, so that there is no need to increase the dielectric breakdown strength. In the prior art, since the well (base) of each transistor was grounded, a large voltage was applied between the well (base) and the gate even if a fraction of the total voltage was applied between the source and drain of each transistor.

Figure 20:
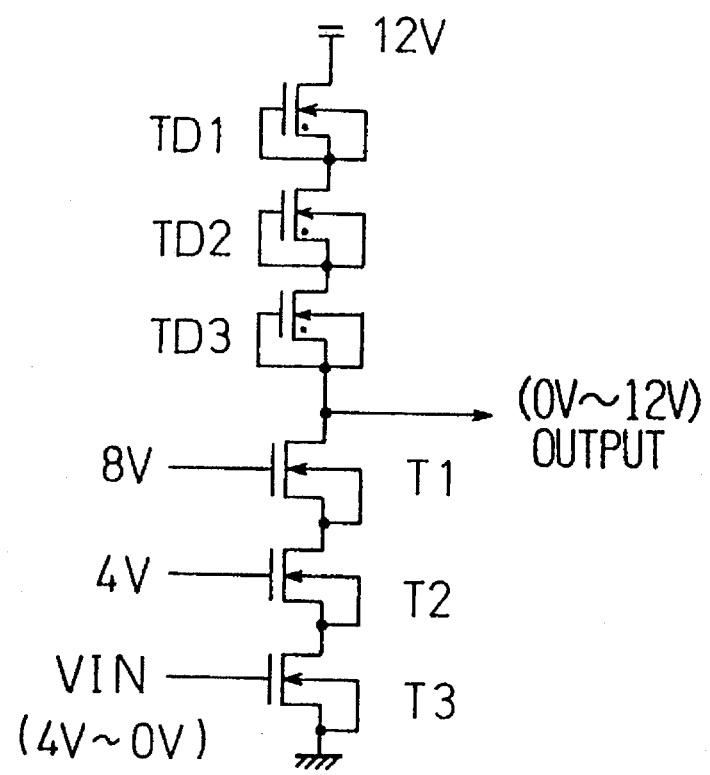
FIG. 20 is a diagram showing the circuit constitution of the second embodiment.

FIG. 20 shows a level conversion circuit for converting the voltage level from 4 V to 12 V according to the second embodiment of the invention. When VIN is 4 V, T3, T2, and T1 are turned on, and the output is at 0 V. At this time, load transistors, TD1, TD2, and TD3, are all conducting; however, the voltage differential applied to each individual load transistor (the voltage differential between the drain and source and gate and well) is divided through resistors into three equal parts, the maximum being 4 V, so that high-voltage transistors need not be used for TD1, TD2, and TD3. When VIN is 0 V, T3 is OFF. Since TD1, TD2, and TD3 are all conducting, the output is 12 V. At this time, since 8 V is applied to the gate of T1, the source of T1 is at 8 V -threshold voltage Vth (=8 V maximum); thus, the voltage differential applied to T1 is 4 V at the maximum, so that T1 need not be a high-voltage type. Likewise, since 4 V is applied to the gate of T2, the source of T2 is at 4 V - Vth (=4 V maximum); thus, the voltage differential applied to T2 is 4 V at the maximum, so that T2 need not be a high-voltage type.

In some applications a VPP higher than the internal VPP may be supplied externally to the flash memory in order to maintain compatibility with other makes. Using the circuit configuration of the present invention, the external VPP can be reduced to produce the internal VPP for transistors having just enough dielectric strength to sustain the internal VPP.

Figure 21:
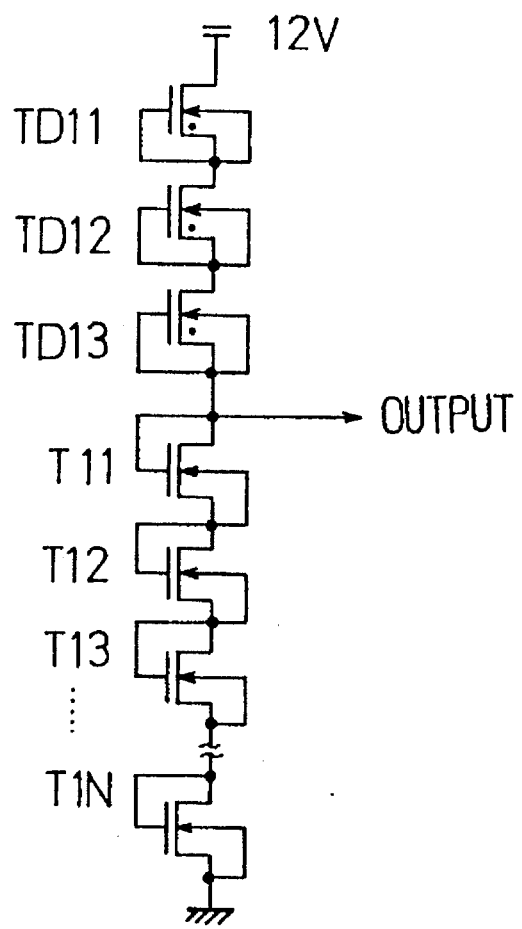
FIG. 21 is a diagram showing the circuit constitution of a third embodiment.

FIG. 21 is a diagram showing a constant-voltage generating circuit according to the third embodiment of the invention.

The sources of enhancement-mode transistors, T11, T12, ..., TIN, are connected to their associated wells; therefore, the back bias for each transistor is 0 V, and a constant voltage of n×Vth is generated. This voltage is independent of the supply voltage and the transistor back bias characteristic, and depends only on the Vth of the transistors. In the example shown, all the enhancement-mode transistors have the same Vth, but two or more kinds of enhancement-mode transistors having different Vth's may be used. Further, in the illustrated example, each transistor is formed in an isolated well, but alternatively, two or more transistors may be formed in one well.

Figure 22:
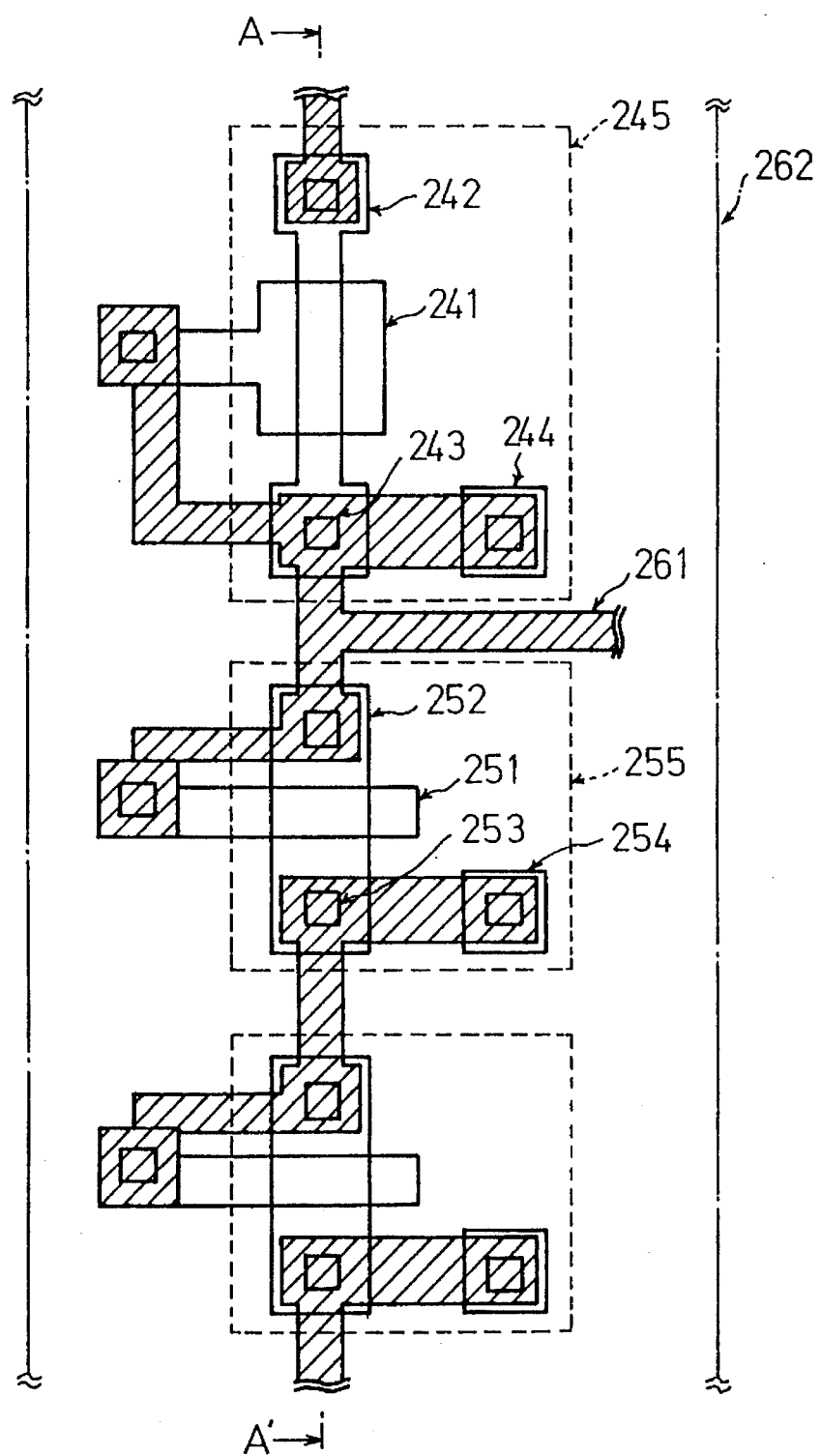
FIG. 22 is a top plan view of a portion of the third embodiment.
Figure 23:
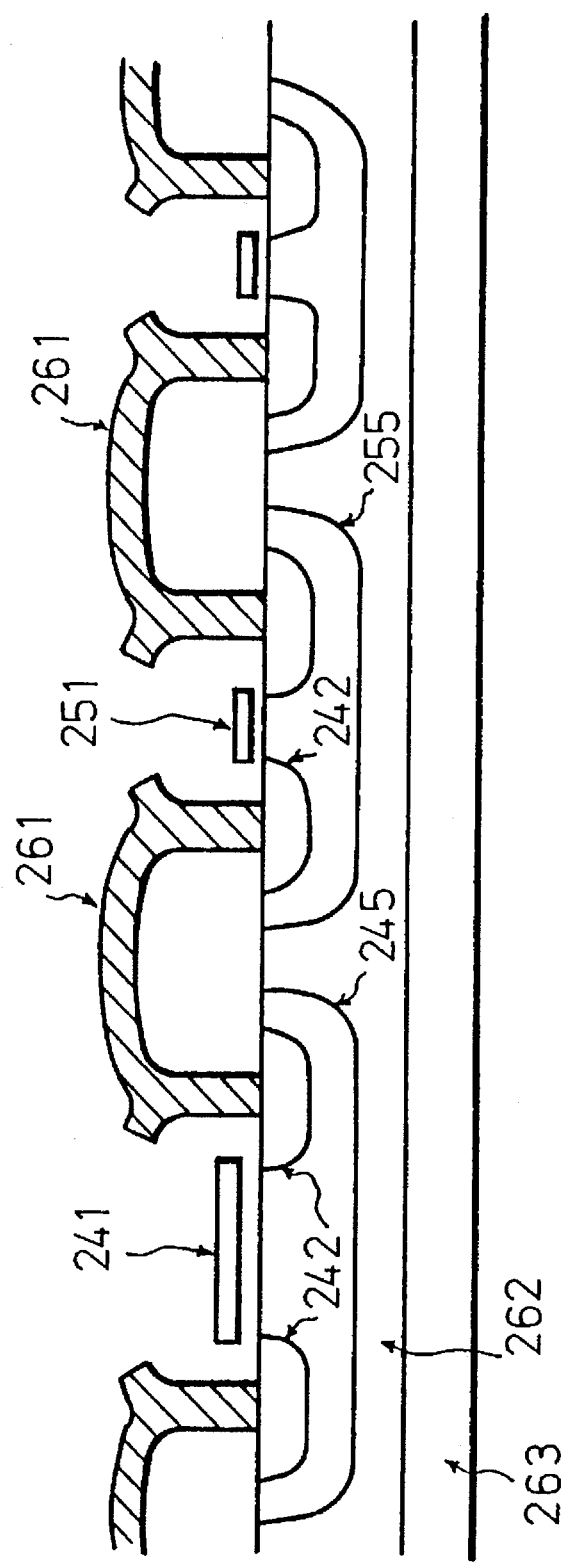
FIG. 23 is a cross-sectional view of FIG. 22.

FIG. 22 is a top plan view of the depletion-mode transistor TD13 and the enhancement-mode transistors T11, T12 shown in FIG. 21, and FIG. 23 is a cross-sectional view of the same. In these FIGS, 241 and 251 indicate polysilicon gates, 242 and 252 indicate n-type diffusion layers, 243 and 253 indicate electrode windows, 244 and 254 indicate p-type diffusion layers, 245 and 255 indicate p-wells, 261 inicates an interconnection layer, 262 indicates an n-well, and 263 indicates a p-type substrate.

Figure 24:
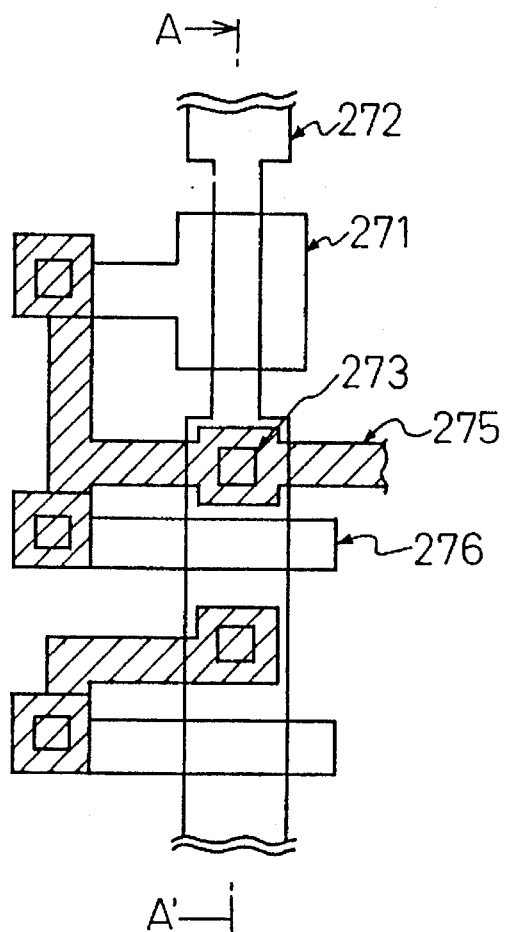
FIG. 24 shows a top plan view of a prior art constant-voltage circuit.
Figure 25:
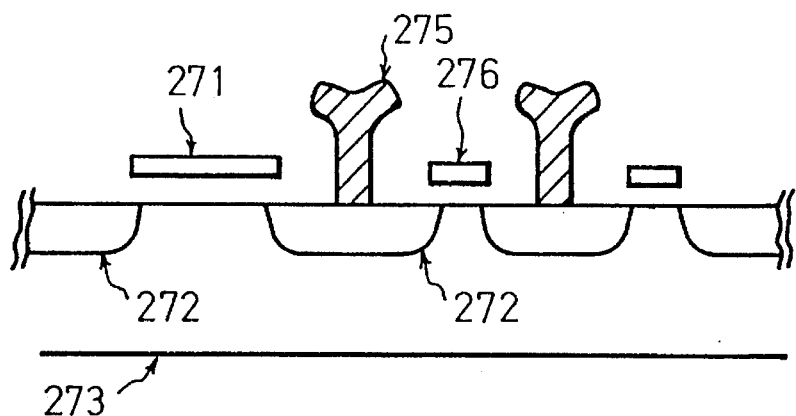
FIG. 25 shows a cross-sectional view of a prior art constant-voltage circuit.

To clarify the differences from the prior art structure, top plan and cross-sectional views of the prior art constant-voltage circuit illustrated in FIG. 18 are shown in FIGS. 24 and 25.

Figure 26:
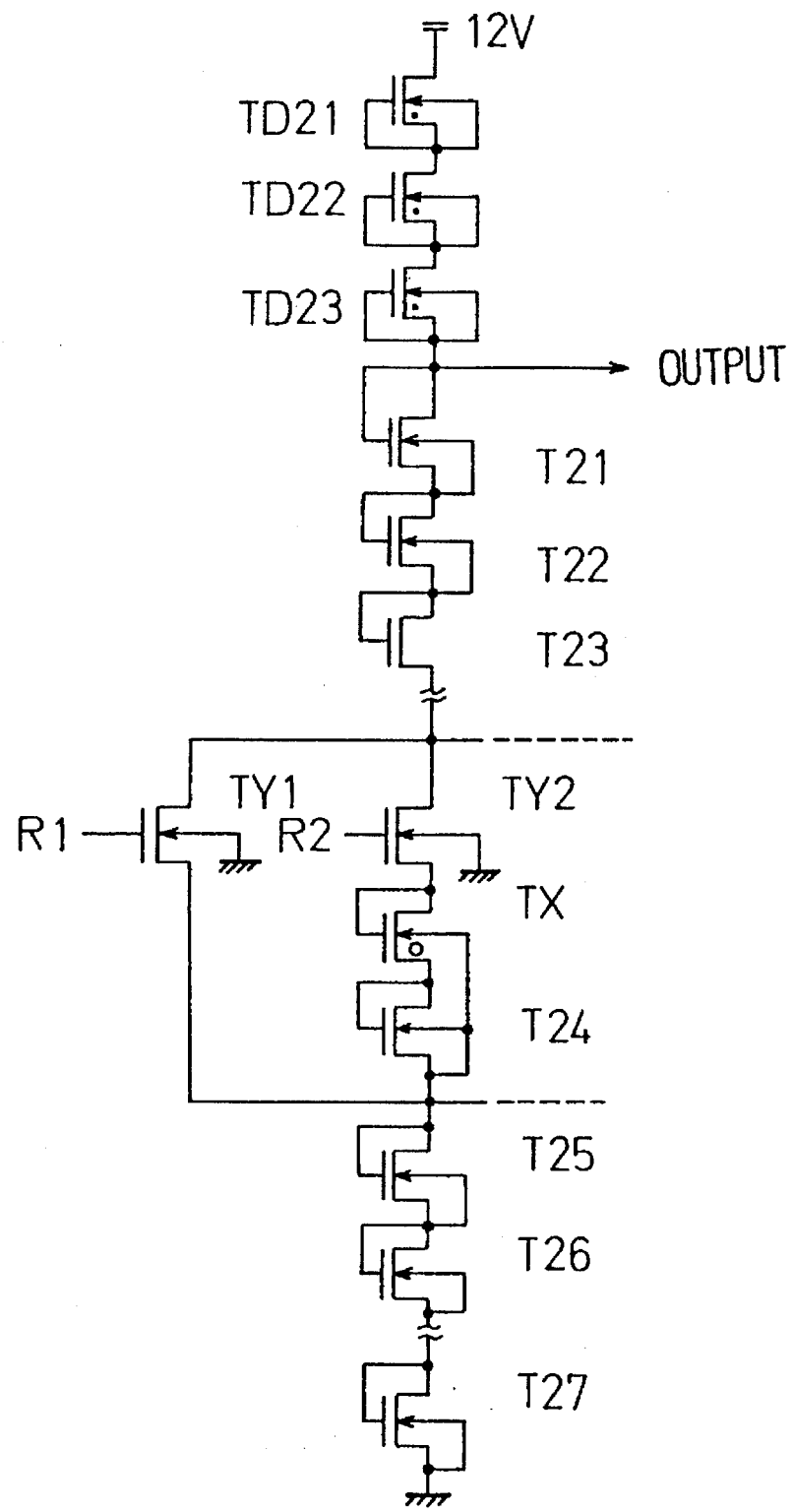
FIG. 26 is a diagram showing the circuit constitution of a fourth embodiment.

FIG. 26 shows a circuit configuration wherein a transistor array, consisting of series-connected transistors TY2, TX, and T24, and a transistor TY1 connected in parallel to the array are inserted in the enhancement-mode transistor array in the circuit of the third embodiment shown in FIG. 21. The transistor TX is a non-dose type, and its threshold voltage Vth is almost zero. The wells of the transistors TY1 and TY2 are grounded, and signals R1 and R2 are applied to their respective gates. By setting the signal levels applied to R1 and R2 by means of an electric fuse or nonvolatile ROM, the added circuit section can be short-circuited or connected. Thus, the number of transistor stages connected can be adjusted to compensate for variations in the transistor threshold voltage Vth and ensure the correct voltage output.

In the present invention, the circuit area is increased because of an increased number of circuit elements, but the increase in the circuit area is not large in an integrated circuit that uses the high voltage only for a portion thereof. Rather, since the limits previously imposed on the scaling technique by the use of high-voltage transistors are eliminated, other circuit portions can be made even smaller.

According to the second mode, the fabrication process can be simplified without substantially increasing the chip size even in high voltage portions, and circuits less sensitive to fabrication variations can be produced in quantities at reduced costs.

Figure 27:
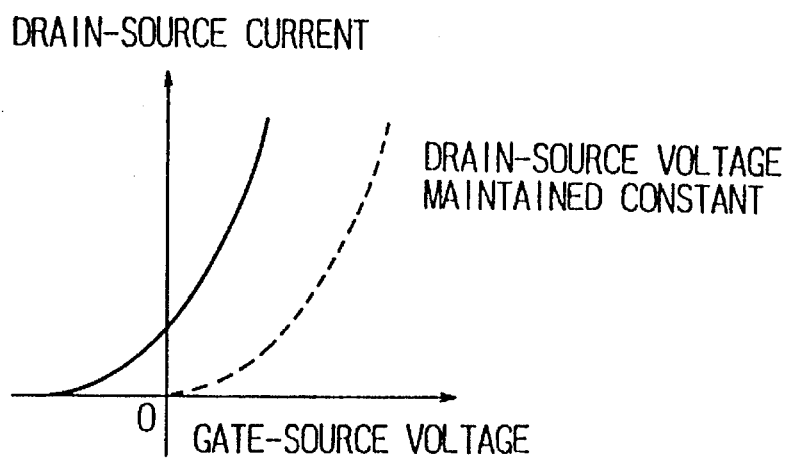
FIG. 27 is a diagram showing the current characteristics of enhancement-mode and depletion-mode transistors when the voltage between gate and source varies.
Figure 28:
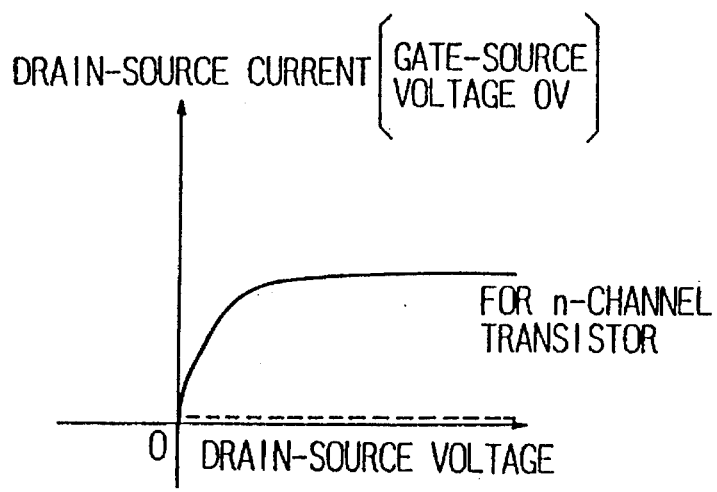
FIG. 28 is a diagram showing the current characteristics of enhancement-mode and depletion-mode transistors when the voltage between drain and source varies.

As shown in FIGS. 16, 18, 20 and 21, depletion-mode transistors as well as enhancement-mode transistors are widely used in power supply circuits and the like. FIGS. 27 and 28 presents diagrams showing the characteristics of an enhancement-mode transistor and a depletion-mode transistor, both of n-channel type: FIG. 27 shows the current characteristics when the gate-source voltage is varied, and FIG. 28 shows the current characteristics when the drain-source voltage is varied.

In the case of p-channel devices, the gate-source voltage in FIG. 27 is of opposite polarity. The above two types of transistor are distinguished from one another based on the presence or absence of the channel with zero gate bias. In an enhancement-mode device, no channel exists with zero gate bias; in a depletion-mode device, the channel exists with zero gate bias.

The basic concept of a circuit using MOS transistors is that the gate bias is controlled to control the channel formation and thereby control the current flow between the source and the drain. In the case of the depletion-mode transistor, however, since the channel is formed when no gate bias is applied, as described above, the control by the gate bias is complex compared with the enhancement-mode transistor. Therefore, circuit design is usually done based on enhancement-mode devices.

This does not, however, preclude the use of depletion-mode transistors from the circuit design; depending on applications, far more efficient circuit design may be done using depletion-mode devices rather than using enhancement-mode ones. Constant-voltage sources and signal switching devices (transfer gates) are specific examples.

When using a transistor as a transfer gate, to cause current flow, a potential difference that matches the amount of the current needs to be caused between the gate and source. For the same amount of current, the depletion-mode device allows a smaller potential difference, as shown in FIG. 27. Furthermore, with the same gate voltage, signal decay between the drain and source is smaller in the depletion-mode device.

To implement a constant-current source circuit using a depletion-mode transistor, the characteristics shown in FIG. 28 are utilized. In the depletion-mode device, since current flows at zero gate-source voltage, when a voltage greater than a certain magnitude is applied between the drain and source with the gate and source short-circuited, the drain-source current is maintained at a constant level independently of the drain-source voltage.

Figure 29:
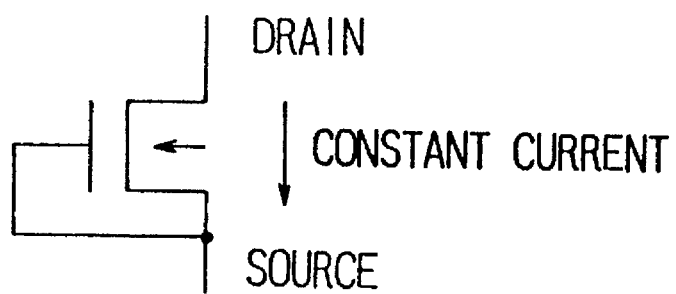
FIG. 29 is a diagram showing a constant-current circuit utilizing a depletion-mode transistor.

A specific example of the circuit configuration is shown in FIG. 29.

Thus, using the depletion-mode transistor, the constant-current circuit can be implemented by a single transistor.

As previously described, effective circuit design can be realized using depletion-mode transistors for such a power supply circuit as described above. To implement a depletion-mode transistor, a wafer process-like technique is usually used. That is, a large number of charges of the same polarity as the charges that form the channel are distributed in the channel region of a MOS transistor. For example, in the case of an n-channel depletion-mode transistor, the device is formed so that its channel region predominantly contains charges of negative polarity; conversely, a p-channel depletion-mode transistor is formed so that charges of positive polarity are predominant in its channel region. In practice, to provide the MOS transistor channel region with the above charge profile, p- or n-type impurities are ionized and accelerated by a field For injection into the channel region. This technique is generally called ion implantation.

Ion implantation is not only used for the formation of depletion-mode transistors, but the same technique is also used for forming n-channel and p-channel enhancement-mode transistors usually used as circuit elements. However, since enhancement-mode and depletion-mode devices require different charge distributions in the channel region, the charge distribution in the channel region is adjusted by varying the ion dose, the kind of ion implant, the field strength, etc. This means that the fabrication of deletion-mode transistors inevitably involves increased kinds of ion implants in the wafer processing steps. An increased number of processing steps causes such problems as increased complexity of the wafer process and increased time for process setup, leading finally to increased costs of the semiconductor devices.

In a semiconductor device of the third mode of the present invention, the depletion-mode transistor can be produced more easily.

Figure 30:
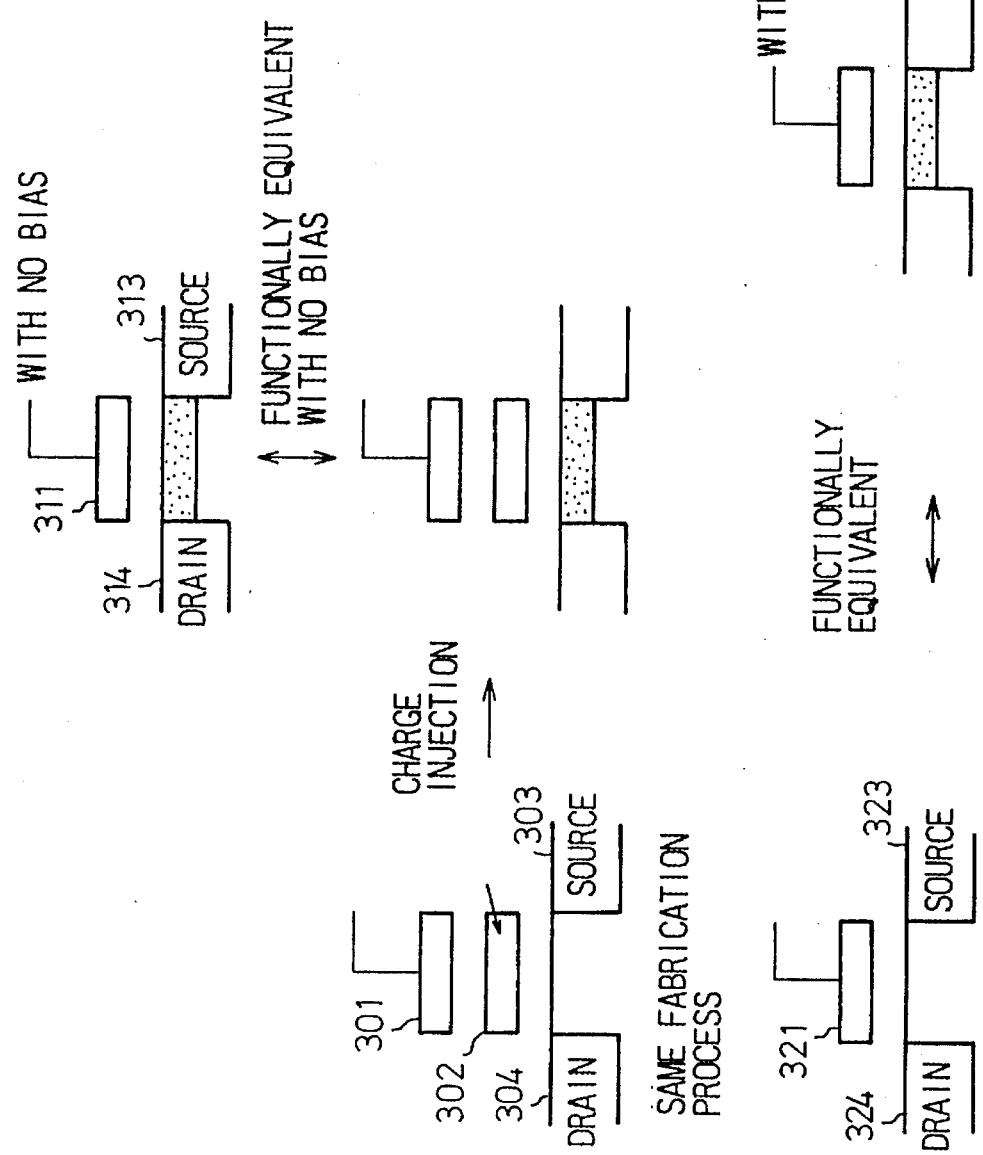
FIG. 30 is a diagram showing a basic functional constitution of a third mode of the invention.

FIG. 30 is a diagram showing the basic functional configuration of a third mode of the present invention.

As shown in FIG. 30, the MOS transistor according to the third mode of the invention has a floating gate 302 and is formed by an enhancement-mode device manufacturing process, the structure being such that a charge is injected into the floating gate 302 and a channel is formed with zero bias application as in a depletion-mode device.

According to the configuration of the third mode, the MOS transistor formed is an enhancement-mode device but has a floating gate 302. The charge injected into the floating gate 302 is retained there almost indefinitely, and the threshold voltage of the MOS transistor is determined by the type and amount of the injected charge. In the case of a p-channel MOS transistor, for example, injecting a negative charge into the floating gate 302 results in a lower threshold voltage, and the channel is formed without requiring bias application. Such a transistor is a functional equivalent of a depletion-mode transistor, realizing in effect a depletion-mode transistor.

Figure 31:
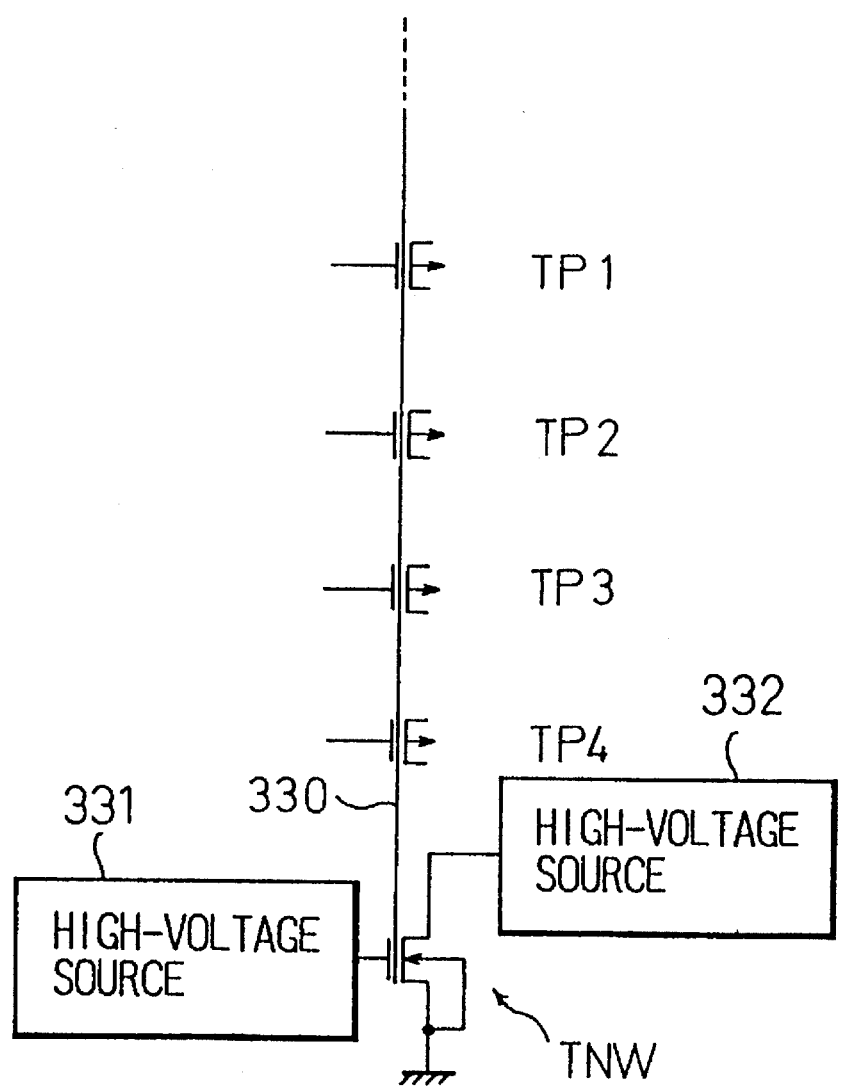
FIG. 31 is a diagram showing the constitution of a fifth embodiment.

FIG. 31 is a diagram showing the configuration of a fifth embodiment. The diagram shows a portion of a semiconductor device where depletion-mode MOS transistors should be formed. TP1 to TP4 indicate enhancement-mode transistors formed in the portion where depletion-mode MOS transistors should be formed. The transistors have a common floating gate 330. TNW indicates an n-channel MOS transistor having the common floating gate. This transistor has a structure similar to the flash memory cell so far described. The source and well of the transistor TNW are connected together, and a high voltage is applied to the gate and drain to inject a negative charge, i.e., electrons, into the common floating gate 330. This charge injection is performed during manufacture of the device.

By injecting electrons into the common floating gate 330 in the transistor TNW, the electrons are accumulated on the common floating gate 330 in the enhancement-mode transistors TP1, TP2, TP3, TP4, . . . , and retained there semipermanently. As described in connection with FIG. 3, in the p-channel MOS transistor, the threshold voltage rises when electrons are injected into the floating gate, so that the channel is formed and conduction takes place with zero bias, the transistor thus functioning in the same manner as a depletion-mode MOS transistor.

High-voltage sources 331 and 332, which are booster circuits for supplying high voltages to the gate and drain of the transistor TNW, may be built into the semiconductor device, but since the charge injection into the common floating gate 330 needs to be done only once during the manufacture, it is desirable that special electrode pads be connected to the gate and drain, respectively, and that the high voltages be applied externally via these special electrode pads during the manufacture.

When the floating gates of all the transistors functioning in depletion mode are connected in common in the device, only one n-channel transistor TNW may be provided for injecting the electrons into the common floating gate 330. Alternatively, the transistors may be divided into a plurality of groups for convenience of interconnections, or otherwise, one write transistor may be provided for each depletion-mode functioning transistor.

Figure 32:
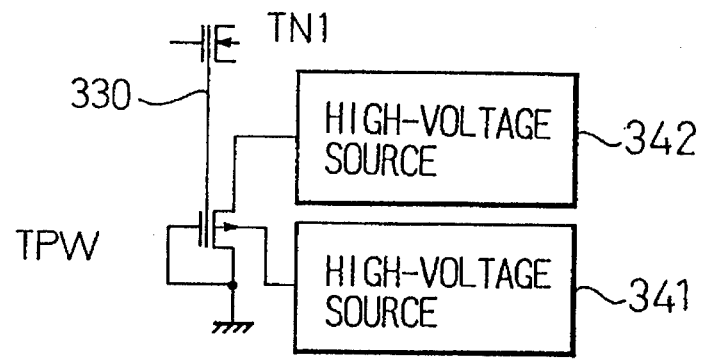
FIG. 32 is a diagram showing the constitution of a sixth embodiment.

FIG. 32 is a diagram showing the configuration of a sixth embodiment wherein the depletion-mode functioning MOS transistors are formed as n-channel devices and a p-channel transistor TPW for positive charge injection is provided for one n-channel transistor TN1. The floating gates of the two transistors TN1 and TPW are connected to the common floating gate 330. Injection of the positive charge is accomplished by applying high voltages to the well and drain. In an alternative method, a high voltage may be applied only to the well.

In the fifth and sixth embodiments, a dedicated charge-injection transistor is provided to inject the charge into the common floating gate. In this configuration, the gate oxide film through which the charge tunnels need only be formed in the charge-injection transistor region, which offers the advantage that such a gate oxide film need not be formed in the depletion-mode functioning transistors.

However, when the number of depletion-mode functioning transistors is small, the gate oxide film through which the tunneling occurs may be formed in each of the depletion-mode functioning MOS transistors so that the charge is injected in each individual transistor. The seventh embodiment shown in FIG. 33 concerns such a structure.

Figure 33:
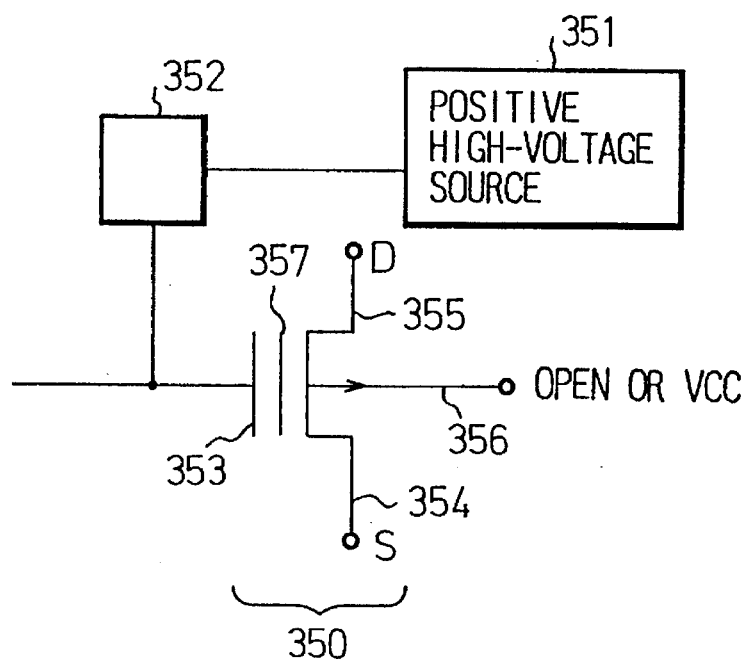
FIG. 33 is a diagram showing the constitution of a seventh embodiment.

In FIG. 33, the numeral 350 indicates a p-channel transistor that is made to operate in depletion mode, 353 indicates a gate, 354 indicates a source, 355 indicates a drain, 356 indicates a well, 352 indicates a special electrode pad connected to the gate 353, and 351 indicates an external positive high-voltage supply.

When the fabrication of the semiconductor device including the portion shown in FIG. 33 is completed, operation of other portions is stopped, and the source 354 and drain 355, and if necessary, the well 356, are set open, after which a high voltage is applied from the positive high-voltage power supply 351 to the gate 353 via the special electrode pad 352. This causes electrons to be injected into the floating gate 357, and the enhancement-mode p-channel transistor 350 is set so as to operate in depletion mode.

FIGS. 34A to 34B show the structure in which the structure shown in FIG. 31 is embodied according to an eighth embodiment in which the device is formed by a wafer process using two or more polysilicon interconnection layers. FIGS. 35A to 35D show the structure in which the structure shown in FIG. 32 is embodied according to a ninth embodiment in which the device is formed by a wafer process using a single polysilicon interconnection layer. FIGS. 34A and 35A show top plan views and FIGS. 34B and 35B show cross sections taken along line Y—Y'. FIG. 34C shows an X—X' cross sections, while FIG. 35C shows an X1—X1' cross section and FIG. 35D shows an X2—X2' cross section.

In the figures, the numerals 361 and 371 indicate polysilicon floating gates, 364 and 375 indicate first diffusion layers, and 365 and 375 indicate second diffusion layers. The numerals 362 and 363 indicate a second polysilicon layer corresponding to a gate, and 372 indicates a first diffusion layer corresponding to a gate.

Furthermore, according to the third mode, transistors equivalent in circuit operation to depletion-mode devices can be fabricated using a wafer process specifically designed for enhancement-mode transistor fabrication. The invention can be embodied in almost all devices fabricated by CMOS wafer process.

This achieves device fabrication at lower costs than when the depletion-mode transistors are fabricated by relying solely on the wafer process technology. Furthermore, even in the case of a newly developed wafer process, the number of processing steps necessary for setup can be reduced as compared to the case where the depletion-mode devices are fabricated by relying solely on the wafer process technology. The invention thus contributes to shortening the period of product development.

We claim:

1. A semiconductor device comprising:

a first semiconductor device connected between a high-voltage power supply and an output; and a second semiconductor device connected between said output and ground;

said first semiconductor device including a first plurality of electrically isolated p-type wells, wherein at least two of said first plurality of p-type wells each has a first n-channel depletion-mode transistor formed therein, wherein the first n-channel depletion-mode transistor in a first well is connected in series with the first n-channel depletion mode transistor in a second well, a source of the said first n-channel depletion-mode transistor in a first respective first or second well is connected to the first respective well, and a gate of said first n-channel depletion-mode transistor is connected to a drain thereof; and said second semiconductor device including a second plurality of electrically isolated p-type wells, wherein at least two of said second plurality of p-type wells each has a first n-channel enhancement-mode transistor formed therein, wherein the n-channel enhancement-mode transistor in a first well of said second plurality of p-type well is connected in series with the first n-channel enhancement-mode transistor in a second well of said second plurality of p-type wells, a source of the first n-channel enhancement-mode transistor in a second respective first or second well is connected to said second respective well, and a gate of said first n-channel enhancement-mode transistor is connected to a drain thereof.

2. A semiconductor device comprising:

a first semiconductor device connected between a high-voltage power supply and an output; and a second semiconductor device connected between said output and ground;

said first semiconductor device including a first plurality of electrically isolated p-type wells, wherein at least two of said first plurality of p-type wells each has a first n-channel depletion-mode transistor formed therein, wherein the first n-channel depletion-mode transistor in a first well is connected in series with the first n-channel depletion mode transistor in a second well, a source of the said first n-channel depletion-mode transistor in a first respective first or second well is connected to the first respective well, and a gate of said first n-channel depletion-mode transistors is connected to a drain thereof; and said second semiconductor device including a plurality of electrically isolated p-type wells, wherein at least two of said plurality of p-type wells each has a first n-channel enhancement-mode transistor formed therein, wherein n-channel enhancement-mode transistors in a first well of said second plurality of p-type wells are connected in series with the first n-channel enhancement-mode transistor in a second well of said second plurality of p-type well, a source of the first n-channel enhancement-mode transistor in a second respective first or second well is connected to said second respective well, and a gate of said first n-channel enhancement-mode transistor is connected to a drain thereof and a voltage of an order of (n-m)/n of said high-voltage power supply is applied to a gate of an m-th enhancement-mode transistor, and 0 V or a voltage of an order of 1/n of said high-voltage power supply is applied to a gate of an n-th enhancement-mode transistor, thereby outputting at its output a high voltage or 0 V electrical signal.

3. A semiconductor device according to claim 1, wherein said second semiconductor device is so configured as to permit trimming of a number of stages of n-channel enhancement-mode transistors.

4. A semiconductor device, comprising:

a first semiconductor device connected between a high-voltage power supply and an output; and a second semiconductor device connected between said output and ground;

said first semiconductor device including a first plurality of electrically isolated p-type wells, wherein at least two of said first plurality of p-type wells each has n-channel depletion-mode transistor means formed therein, said n-channel depletion-mode transistor means for processing electrical signals therethrough, wherein the n-channel depletion-mode transistor means in a first well are connected in series with the n-channel depletion-mode transistor means in a second well, and wherein a source of the n-channel depletion-mode transistor means of a first respective first or second well is connected to the first respective well, and wherein a gate of the n-channel depletion-mode transistor means is connected to a drain thereof; and said second semiconductor device including a second plurality of electrically isolated p-type wells, wherein at least two of said second plurality of p-type wells each has n-channel enhancement-mode transistor means formed therein, said n-channel enhancement-mode transistor means for processing electrical signals therethrough, wherein n-channel enhancement-mode transistor means in a first well of said second plurality of p-type wells are connected in series with n-channel enhancement-mode transistor means in a second well of said second plurality of p-type wells, and wherein a source of the n-channel enhancement-mode transistor means in a second respective first or second well is connected to the second respective well, and a gate of the n-channel enhancement-mode transistor means is connected to a drain thereof.

5. A semiconductor device as recited in claim 4, wherein at least one of said n-channel depletion-mode transistor means comprises a plurality of n-channel depletion-mode transistors, said plurality of n-channel depletion-mode transistors being connected in series with each other.

6. A semiconductor device as recited in claim 4, wherein at least one of said n-channel enhancement-mode transistor means comprises a plurality of n-channel enhancement-mode transistors, said plurality of n-channel enhancement-mode transistors being connected in series with each other.

7. A semiconductor device as recited in claim 4, wherein at least one of said n-channel depletion-mode transistor means comprises one n-channel depletion-mode transistor.

8. A semiconductor device as recited in claim 4, wherein at least one of said n-channel enhancement-mode transistor means comprises one n-channel enhancement-mode transistor.

9. A semiconductor device as recited in claim 1, wherein one of said at least two p-type wells of said first plurality of p-type wells has a second n-channel depletion-mode transistor formed therein, said second depletion-mode transistor being connected in series with said first n-channel depletion-mode transistor.

10. A semiconductor device as recited in claim 1, wherein one of said at least two p-type wells of said second plurality of wells has a second n-channel enhancement-mode transistor formed therein, said second enhancement-mode transistor being connected in series with said first n-channel enhancement-mode transistor.

11. A semiconductor device as recited in claim 2, wherein one of said at least two p-type wells of said first plurality of wells has a second n-channel depletion-mode transistor formed therein, said second depletion-mode transistor being connected in series with said first n-channel depletion-mode transistor.

12. A semiconductor device as recited in claim 2, wherein one of said at least two p-type wells of said second plurality of wells has a second n-channel enhancement-mode transistor formed therein, said second enhancement-mode transistor being connected in series with said first n-channel enhancement-mode transistor.

* * * * *